(12) United States Patent
Yamazaki et al.

(10) Patent No.: US 7,679,087 B2
(45) Date of Patent: Mar. 16, 2010

(54) SEMICONDUCTOR ACTIVE REGION OF TFTS HAVING RADIAL CRYSTAL GRAINS THROUGH THE WHOLE AREA OF THE REGION

(75) Inventors: Shunpei Yamazaki, Setagata-ku (JP); Satoshi Teramoto, Atsugi (JP); Jun Koyama, Sagamihara (JP); Yasushi Ogata, Atsugi (JP); Masahiko Hayakawa, Atsugi (JP); Mitsuaki Osame, Atsugi (JP); Hisashi Ohtani, Isehara (JP); Toshiji Hamatani, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 145 days.

(21) Appl. No.: 10/214,691

(22) Filed: Aug. 9, 2002

(65) Prior Publication Data
US 2003/0001158 A1 Jan. 2, 2003

Related U.S. Application Data

(62) Division of application No. 08/785,486, filed on Jan. 17, 1997, now Pat. No. 6,528,820.

(30) Foreign Application Priority Data

| Jan. 19, 1996 | (JP) | 8-26210 |
| Jan. 20, 1996 | (JP) | 8-26037 |
| Jan. 26, 1996 | (JP) | 8-32874 |
| Jan. 26, 1996 | (JP) | 8-32875 |
| Jan. 27, 1996 | (JP) | 8-32981 |
| Feb. 20, 1996 | (JP) | 8-58334 |
| Mar. 17, 1996 | (JP) | 8-88759 |
| Nov. 21, 1996 | (JP) | 8-326068 |

(51) Int. Cl.
*H01L 29/04* (2006.01)
*H01L 31/0392* (2006.01)

(52) U.S. Cl. .............................. 257/64; 257/66; 257/72; 257/E33.003; 257/E33.064; 257/E27.131; 257/E27.132

(58) Field of Classification Search .................. 257/59, 257/72, 349, 350, 49–51, 347, 64, 66, E27.132, 257/E29.003, E29.292, E21.415, E29.004, 257/E29.273, 83
See application file for complete search history.

(56) References Cited

U.S. PATENT DOCUMENTS 3,389,024 A 6/1968 Schimmer
(Continued)

FOREIGN PATENT DOCUMENTS

CN 1109212 9/1995
(Continued)

OTHER PUBLICATIONS

Wolf, *Silicon Processing for the VLSI Era*, vol. 2, Chapter 4, p. 274 (1990).
(Continued)

*Primary Examiner*—Ngan Ngo
*Assistant Examiner*—Benjamin Tzu-Hung Liu
(74) *Attorney, Agent, or Firm*—Eric J. Robinson; Robinson Intellectual Property Law Office, P.C.

(57) ABSTRACT

There is disclosed a method of fabricating a thin-film transistor having excellent characteristics. Nickel element is held in contact with selected regions of an amorphous silicon film. Then, thermal processing is performed to crystallize the amorphous film. Subsequently, thermal processing is carried out in an oxidizing ambient containing a halogen element to form a thermal oxide film. At this time, the crystallinity is improved. Also, gettering of the nickel element proceeds. This crystalline silicon film consists of crystals grown radially from a number of points. Consequently, the thin-film transistor having excellent characteristics can be obtained.

36 Claims, 9 Drawing Sheets

U.S. PATENT DOCUMENTS

| | | |
|---|---|---|
| 3,783,049 A | 1/1974 | Sandera |
| RE28,385 E | 4/1975 | Mayer |
| RE28,386 E | 4/1975 | Heiman et al. |
| 3,890,632 A | 6/1975 | Ham et al. |
| 4,059,461 A | 11/1977 | Fan et al. |
| 4,068,020 A | 1/1978 | Reuschel |
| 4,086,020 A | 4/1978 | Tanabe et al. |
| 4,132,571 A | 1/1979 | Cuomo et al. |
| 4,140,548 A | 2/1979 | Zimmer |
| 4,174,217 A | 11/1979 | Flatley |
| 4,226,898 A | 10/1980 | Ovshinsky et al. |
| 4,231,809 A | 11/1980 | Schmidt |
| 4,271,422 A | 6/1981 | Ipri |
| 4,277,884 A | 7/1981 | Hsu |
| 4,300,989 A | 11/1981 | Chang |
| 4,309,224 A | 1/1982 | Shibata |
| 4,330,363 A | 5/1982 | Biefesen et al. |
| 4,331,709 A | 5/1982 | Risch et al. |
| 4,379,020 A | 4/1983 | Glaeser et al. |
| 4,409,724 A | 10/1983 | Tasch, Jr. et al. |
| 4,466,073 A | 8/1984 | Boyan et al. |
| 4,472,458 A | 9/1984 | Sirinyan et al. |
| 4,481,121 A | 11/1984 | Barthel |
| 4,511,800 A | 4/1985 | Harbeke et al. |
| 4,534,820 A | 8/1985 | Mori et al. |
| 4,544,418 A | 10/1985 | Gibbons |
| 4,546,376 A | 10/1985 | Nakata et al. |
| 4,597,160 A | 7/1986 | Ipri |
| 4,634,473 A | 1/1987 | Swartz et al. |
| 4,735,824 A | 4/1988 | Yamabe et al. |
| 4,755,481 A | 7/1988 | Faraone |
| 4,759,610 A | 7/1988 | Yanagisawa |
| 4,911,781 A | 3/1990 | Fox et al. |
| 4,931,787 A * | 6/1990 | Shannon ............... 345/93 |
| 4,959,247 A | 9/1990 | Moser et al. |
| 4,959,700 A | 9/1990 | Yamazaki |
| 4,975,760 A | 12/1990 | Dohjo et al. |
| 4,996,077 A | 2/1991 | Mosiehi et al. |
| 4,996,523 A | 2/1991 | Bell et al. |
| 5,043,224 A | 8/1991 | Jaccodine et al. |
| 5,075,259 A | 12/1991 | Moran |
| 5,089,441 A | 2/1992 | Mosiehi |
| 5,112,764 A | 5/1992 | Mitra et al. |
| 5,132,754 A | 7/1992 | Serikawa et al. |
| 5,145,808 A | 9/1992 | Sameshima et al. |
| 5,147,826 A | 9/1992 | Liu et al. |
| 5,173,446 A | 12/1992 | Asakawa et al. |
| 5,182,620 A * | 1/1993 | Shimada et al. ............ 257/72 |
| 5,200,630 A | 4/1993 | Nakamura et al. |
| 5,210,050 A | 5/1993 | Yamazaki et al. |
| 5,221,423 A | 6/1993 | Sugino et al. |
| 5,225,355 A | 7/1993 | Sugino et al. |
| 5,244,836 A | 9/1993 | Lim |
| 5,254,480 A | 10/1993 | Tran |
| 5,262,350 A | 11/1993 | Yamazaki et al. |
| 5,262,654 A | 11/1993 | Yamazaki |
| 5,274,250 A | 12/1993 | Miyake et al. |
| 5,275,851 A | 1/1994 | Fonash et al. |
| 5,278,093 A | 1/1994 | Yonehara |
| 5,289,030 A | 2/1994 | Yamazaki et al. |
| 5,296,405 A | 3/1994 | Yamazaki et al. |
| 5,298,075 A | 3/1994 | Lagendijk et al. |
| 5,300,187 A | 4/1994 | Lesk et al. |
| 5,306,651 A | 4/1994 | Masumo et al. |
| 5,308,998 A | 5/1994 | Yamazaki et al. |
| 5,313,075 A | 5/1994 | Zhang et al. |
| 5,313,076 A | 5/1994 | Yamazaki et al. |
| 5,352,291 A | 10/1994 | Zhang et al. |
| 5,354,697 A | 10/1994 | Oostra et al. |
| 5,358,907 A | 10/1994 | Wong |
| 5,365,080 A | 11/1994 | Yamazaki et al. |
| 5,366,926 A | 11/1994 | Mei et al. |
| 5,372,860 A | 12/1994 | Fehlner et al. |
| 5,387,530 A | 2/1995 | Doyle et al. |
| 5,395,804 A | 3/1995 | Ueda |
| 5,402,141 A | 3/1995 | Haim et al. |
| 5,403,762 A | 4/1995 | Takemura |
| 5,403,772 A | 4/1995 | Zhang et al. |
| 5,414,547 A | 5/1995 | Matsuo et al. |
| 5,424,230 A | 6/1995 | Wakai |
| 5,426,064 A | 6/1995 | Zhang et al. |
| 5,470,763 A | 11/1995 | Hamada |
| 5,480,811 A | 1/1996 | Chiang et al. |
| 5,481,121 A | 1/1996 | Zhang et al. |
| 5,488,000 A | 1/1996 | Zhang et al. |
| 5,492,843 A | 2/1996 | Adachi et al. |
| 5,501,989 A | 3/1996 | Takayama et al. |
| 5,504,019 A | 4/1996 | Miyasaka et al. |
| 5,508,207 A | 4/1996 | Horai et al. |
| 5,508,533 A | 4/1996 | Takemura |
| 5,529,937 A | 6/1996 | Zhang et al. |
| 5,530,266 A | 6/1996 | Yonehara et al. |
| 5,531,182 A | 7/1996 | Yonehara |
| 5,531,862 A | 7/1996 | Otsubo et al. |
| 5,534,716 A | 7/1996 | Takemura |
| 5,535,471 A | 7/1996 | Guldi |
| 5,543,352 A | 8/1996 | Ohtani et al. |
| 5,543,636 A | 8/1996 | Yamazaki |
| 5,550,070 A * | 8/1996 | Funai et al. ............... 438/486 |
| 5,563,426 A | 10/1996 | Zhang et al. |
| 5,569,610 A | 10/1996 | Zhang et al. |
| 5,569,936 A | 10/1996 | Zhang et al. |
| 5,572,046 A | 11/1996 | Takemura |
| 5,575,883 A | 11/1996 | Nishikawa |
| 5,580,792 A | 12/1996 | Zhang et al. |
| 5,580,815 A | 12/1996 | Hsu et al. |
| 5,585,291 A | 12/1996 | Ohtani et al. |
| 5,589,694 A | 12/1996 | Takayama et al. |
| 5,591,988 A | 1/1997 | Arai et al. |
| 5,595,923 A | 1/1997 | Zhang et al. |
| 5,595,944 A | 1/1997 | Zhang et al. |
| 5,604,360 A | 2/1997 | Zhang et al. |
| 5,605,846 A | 2/1997 | Ohtani et al. |
| 5,606,179 A | 2/1997 | Yamazaki et al. |
| 5,608,232 A | 3/1997 | Yamazaki et al. |
| 5,610,737 A | 3/1997 | Akiyama et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,619,044 A | 4/1997 | Makita et al. |
| 5,620,910 A | 4/1997 | Teramoto |
| 5,621,224 A | 4/1997 | Yamazaki et al. |
| 5,621,244 A | 4/1997 | Lin |
| 5,624,851 A | 4/1997 | Takayama et al. |
| 5,627,086 A | 5/1997 | Noguchi |
| 5,636,042 A * | 6/1997 | Nakamura et al. .......... 349/123 |
| 5,637,515 A | 6/1997 | Takemura |
| 5,639,698 A | 6/1997 | Yamazaki et al. |
| 5,643,826 A | 7/1997 | Ohtani et al. |
| 5,646,424 A | 7/1997 | Zhang et al. |
| 5,654,203 A | 8/1997 | Ohtani et al. |
| 5,656,825 A | 8/1997 | Kusumoto et al. |
| 5,661,056 A | 8/1997 | Takeuchi |
| 5,661,311 A | 8/1997 | Takemura et al. |
| 5,663,077 A | 9/1997 | Adachi et al. |
| 5,663,579 A | 9/1997 | Noguchi |
| 5,677,549 A | 10/1997 | Takayama et al. |
| 5,684,317 A | 11/1997 | Hwang |
| 5,684,365 A | 11/1997 | Tang et al. |
| 5,686,328 A | 11/1997 | Zhang et al. |
| 5,693,541 A | 12/1997 | Yamazaki et al. |
| 5,693,959 A | 12/1997 | Inoue et al. |
| 5,696,003 A | 12/1997 | Makita et al. |

| | | | | | |
|---|---|---|---|---|---|
| 5,696,386 A | 12/1997 | Yamazaki | 5,986,286 A | 11/1999 | Yamazaki et al. |
| 5,696,388 A | 12/1997 | Funada et al. | 5,990,491 A | 11/1999 | Zhang |
| 5,700,333 A | 12/1997 | Yamazaki et al. | 5,990,542 A | 11/1999 | Yamazaki |
| 5,704,986 A | 1/1998 | Chen et al. | 5,994,172 A | 11/1999 | Ohtani et al. |
| 5,705,829 A | 1/1998 | Miyanaga et al. | 6,004,831 A | 12/1999 | Yamazaki et al. |
| 5,712,191 A | 1/1998 | Nakajima et al. | 6,005,648 A | 12/1999 | Zhang et al. |
| 5,717,224 A | 2/1998 | Zhang | 6,006,763 A | 12/1999 | Mori et al. |
| 5,717,473 A | 2/1998 | Miyawaki | 6,008,101 A | 12/1999 | Tanaka et al. |
| 5,728,259 A | 3/1998 | Suzawa et al. | 6,011,275 A | 1/2000 | Ohtani et al. |
| 5,728,610 A | 3/1998 | Gossain et al. | 6,011,277 A | 1/2000 | Yamazaki |
| 5,734,179 A | 3/1998 | Chang et al. | 6,013,929 A | 1/2000 | Ohtani |
| 5,744,822 A | 4/1998 | Takayama et al. | 6,031,249 A | 2/2000 | Yamazaki et al. |
| 5,744,824 A | 4/1998 | Kousai et al. | 6,048,758 A | 4/2000 | Yamazaki et al. |
| 5,756,364 A | 5/1998 | Tanaka et al. | 6,063,654 A | 5/2000 | Ohtani |
| 5,763,899 A | 6/1998 | Yamazaki et al. | 6,069,674 A | 5/2000 | Aomori et al. |
| 5,766,977 A | 6/1998 | Yamazaki | 6,071,764 A | 6/2000 | Zhang et al. |
| 5,773,327 A | 6/1998 | Yamazaki et al. | 6,077,731 A | 6/2000 | Yamazaki et al. |
| 5,773,846 A | 6/1998 | Zhang et al. | 6,077,758 A | 6/2000 | Zhang et al. |
| 5,773,847 A | 6/1998 | Hayakawa | 6,083,801 A | 7/2000 | Ohtani |
| 5,782,665 A | 7/1998 | Weisfield et al. | 6,084,247 A | 7/2000 | Yamazaki et al. |
| 5,783,468 A | 7/1998 | Zhang et al. | 6,093,934 A | 7/2000 | Yamazaki et al. |
| 5,786,796 A | 7/1998 | Takayama et al. | 6,100,562 A | 8/2000 | Yamazaki et al. |
| 5,795,795 A | 8/1998 | Kousai et al. | 6,121,076 A | 9/2000 | Zhang et al. |
| 5,808,321 A | 9/1998 | Mitanaga et al. | 6,121,683 A | 9/2000 | Yamazaki et al. |
| 5,811,327 A | 9/1998 | Funai et al. | 6,133,073 A | 10/2000 | Yamazaki et al. |
| 5,814,540 A | 9/1998 | Takemura et al. | 6,140,165 A | 10/2000 | Zhang et al. |
| 5,818,076 A | 10/1998 | Zhang et al. | 6,147,667 A | 11/2000 | Yamazaki et al. |
| 5,821,138 A | 10/1998 | Yamazaki et al. | 6,156,627 A | 12/2000 | Zhang et al. |
| 5,821,560 A | 10/1998 | Arai et al. | 6,162,704 A | 12/2000 | Yamazaki et al. |
| 5,824,574 A | 10/1998 | Yamazaki et al. | 6,165,876 A | 12/2000 | Yamazaki et al. |
| 5,825,408 A | 10/1998 | Yuyama et al. | 6,168,980 B1 | 1/2001 | Yamazaki et al. |
| 5,828,429 A | 10/1998 | Takemura | 6,175,348 B1 | 1/2001 | Zhang et al. |
| 5,830,784 A | 11/1998 | Zhang et al. | 6,177,302 B1 | 1/2001 | Yamazaki et al. |
| 5,837,569 A | 11/1998 | Makita et al. | 6,180,439 B1 | 1/2001 | Yamazaki et al. |
| 5,838,508 A | 11/1998 | Sugawara | 6,194,254 B1 | 2/2001 | Takemura |
| 5,843,225 A | 12/1998 | Takayama et al. | 6,194,255 B1 | 2/2001 | Hiroki et al. |
| 5,846,857 A | 12/1998 | Ju | 6,207,969 B1 | 3/2001 | Yamazaki et al. |
| 5,849,611 A | 12/1998 | Yamazaki et al. | 6,210,997 B1 | 4/2001 | Adachi et al. |
| 5,851,862 A | 12/1998 | Ohtani et al. | 6,214,684 B1 | 4/2001 | Shoji |
| 5,858,823 A | 1/1999 | Yamazaki et al. | 6,225,152 B1 | 5/2001 | Yamazaki et al. |
| 5,869,362 A | 2/1999 | Ohtani | 6,232,156 B1 | 5/2001 | Ohtani et al. |
| 5,869,363 A | 2/1999 | Yamazaki et al. | 6,278,132 B1 | 8/2001 | Yamazaki et al. |
| 5,879,977 A | 3/1999 | Zhang et al. | 6,288,412 B1 | 9/2001 | Hamada et al. |
| 5,882,960 A | 3/1999 | Zhang et al. | 6,294,441 B1 | 9/2001 | Yamazaki |
| 5,886,366 A | 3/1999 | Yamazaki et al. | 6,319,761 B1 | 11/2001 | Zhang et al. |
| 5,888,857 A | 3/1999 | Zhang et al. | 6,323,071 B1 | 11/2001 | Zhang et al. |
| 5,888,858 A | 3/1999 | Yamazaki et al. | 6,323,072 B1 | 11/2001 | Yamazaki et al. |
| 5,893,730 A | 4/1999 | Yamazaki et al. | 6,331,718 B1 | 12/2001 | Yamazaki et al. |
| 5,895,933 A | 4/1999 | Zhang et al. | 6,337,229 B1 | 1/2002 | Yamazaki et al. |
| 5,897,347 A | 4/1999 | Yamazaki et al. | 6,337,232 B1 | 1/2002 | Kusumoto et al. |
| 5,898,188 A | 4/1999 | Koyama et al. | 6,337,259 B1 | 1/2002 | Ueda et al. |
| 5,899,547 A | 5/1999 | Yamazaki et al. | 6,338,991 B1 | 1/2002 | Zhang et al. |
| 5,902,993 A | 5/1999 | Okushiba et al. | 6,348,367 B1 | 2/2002 | Ohtani et al. |
| 5,904,770 A | 5/1999 | Ohtani et al. | 6,413,805 B1 | 7/2002 | Zhang et al. |
| 5,913,111 A | 6/1999 | Kataoka et al. | 6,423,586 B1 | 7/2002 | Yamazaki et al. |
| 5,922,125 A | 7/1999 | Zhang | 6,455,401 B1 | 9/2002 | Zhang et al. |
| 5,923,997 A | 7/1999 | Mitanaga et al. | 6,461,943 B1 | 10/2002 | Yamazaki et al. |
| 5,929,464 A | 7/1999 | Yamazaki et al. | 6,465,284 B1 | 10/2002 | Adachi et al. |
| 5,929,527 A | 7/1999 | Yamazaki et al. | 6,465,287 B1 | 10/2002 | Yamazaki et al. |
| 5,932,893 A * | 8/1999 | Miyanaga et al. ............. 257/66 | 6,478,263 B1 | 11/2002 | Yamazaki et al. |
| 5,933,205 A | 8/1999 | Yamazaki et al. | 6,479,331 B1 | 11/2002 | Takemura |
| 5,940,690 A | 8/1999 | Kusumoto et al. | 6,482,686 B1 | 11/2002 | Takemura |
| 5,940,732 A | 8/1999 | Zhang | 6,495,404 B1 | 12/2002 | Teramoto et al. |
| 5,949,107 A | 9/1999 | Zhang | 6,528,358 B1 | 3/2003 | Yamazaki et al. |
| 5,953,597 A | 9/1999 | Kusumoto et al. | 6,541,795 B2 | 4/2003 | Kusumoto et al. |
| 5,956,579 A | 9/1999 | Yamazaki et al. | 6,610,142 B1 | 8/2003 | Takayama et al. |
| 5,962,869 A | 10/1999 | Yamazaki et al. | 6,620,711 B2 | 9/2003 | Yamazaki |
| 5,963,278 A | 10/1999 | Yamazaki et al. | 6,713,330 B1 | 3/2004 | Zhang et al. |
| 5,966,594 A | 10/1999 | Adachi et al. | 6,744,069 B1 | 6/2004 | Yamazaki et al. |
| 5,970,327 A | 10/1999 | Makita et al. | 6,806,125 B2 | 10/2004 | Zhang et al. |
| 5,972,105 A | 10/1999 | Yamazaki et al. | 6,872,605 B2 | 3/2005 | Takemura |
| 5,985,704 A | 11/1999 | Adachi et al. | 6,875,628 B1 | 4/2005 | Zhang et al. |
| 5,985,740 A | 11/1999 | Yamazaki et al. | 6,881,615 B2 | 4/2005 | Yamazaki et al. |

| | | |
|---|---|---|
| 6,884,698 B1 | 4/2005 | Ohtani et al. |
| 6,979,840 B1 | 12/2005 | Yamazaki et al. |
| 6,987,283 B2 | 1/2006 | Zhang et al. |
| 6,997,985 B1 | 2/2006 | Yamazaki et al. |
| 7,037,811 B1 | 5/2006 | Yamazaki et al. |
| 7,045,819 B2 | 5/2006 | Takemura |
| 7,056,381 B1 | 6/2006 | Yamazaki et al. |
| 7,078,727 B2 | 7/2006 | Yamazaki et al. |
| 7,173,282 B2 | 2/2007 | Yamazaki et al. |
| 2002/0025659 A1 | 2/2002 | Yamazaki et al. |
| 2002/0048891 A1 | 4/2002 | Yamazaki et al. |
| 2005/0020006 A1 | 1/2005 | Zhang et al. |
| 2005/0153488 A1 | 7/2005 | Takemura |
| 2006/0014337 A1 | 1/2006 | Takemura |
| 2006/0060852 A1 | 3/2006 | Yamazaki et al. |
| 2006/0099780 A1 | 5/2006 | Yamazaki et al. |
| 2006/0236920 A1 | 10/2006 | Yamazaki et al. |
| 2006/0249730 A1 | 11/2006 | Yamazaki et al. |

FOREIGN PATENT DOCUMENTS

| | | |
|---|---|---|
| EP | 0 178 447 | 10/1984 |
| EP | 0 178 447 | 4/1986 |
| EP | 0 612 102 | 8/1994 |
| EP | 0 661 582 | 7/1995 |
| EP | 1 119 053 | 7/2001 |
| JP | 60-105216 | 6/1985 |
| JP | 61-063017 | 4/1986 |
| JP | 61-063107 | 4/1986 |
| JP | 62-169356 | 7/1987 |
| JP | 64-081324 | 3/1989 |
| JP | 01-187814 | 7/1989 |
| JP | 01-187874 | 7/1989 |
| JP | 01-187875 | 7/1989 |
| JP | 01-206632 | 8/1989 |
| JP | 02-140915 | 5/1990 |
| JP | 02-148687 | 6/1990 |
| JP | 02-275641 | 11/1990 |
| JP | 03-280418 | 12/1991 |
| JP | 03-280420 | 12/1991 |
| JP | 05-082442 | 4/1993 |
| JP | 05-107561 | 4/1993 |
| JP | 05-232515 | 9/1993 |
| JP | 05-291220 | 11/1993 |
| JP | 05-299339 | 11/1993 |
| JP | 05-299348 | 11/1993 |
| JP | 06-232059 | 8/1994 |
| JP | 06-296020 | 10/1994 |
| JP | 06-314785 | 11/1994 |
| JP | 06-314787 | 11/1994 |
| JP | 06-318703 | 11/1994 |
| JP | 07-045519 | 2/1995 |
| JP | 07-066425 | 3/1995 |
| JP | 07-094756 | 4/1995 |
| JP | 07-094757 | 4/1995 |
| JP | 07-161634 | 6/1995 |
| JP | 07-192998 | 7/1995 |
| JP | 07-199150 | 8/1995 |
| JP | 07-226373 | 8/1995 |
| JP | 07-231100 | 8/1995 |
| JP | 07-283135 | 10/1995 |
| JP | 07-321339 | 12/1995 |
| JP | 07-335900 | 12/1995 |
| JP | 07-335906 | 12/1995 |
| JP | 08-008439 | 1/1996 |
| JP | 08-023104 | 1/1996 |
| JP | 08-045839 | 2/1996 |
| JP | 08-045840 | 2/1996 |
| JP | 08-097169 | 4/1996 |
| JP | 08-129358 | 5/1996 |
| JP | 08-129359 | 5/1996 |
| JP | 08-129360 | 5/1996 |
| JP | 08-234683 | 9/1996 |
| JP | 08-241047 | 9/1996 |
| JP | 08-241048 | 9/1996 |
| JP | 08-241057 | 9/1996 |
| JP | 08-241997 | 9/1996 |
| KR | 96-005879 | 2/1996 |

OTHER PUBLICATIONS

Japan J. Appl. Phys. 8 (1969) 1059, "Effect of Deposited Metals on the Crystallization Temperature of Amorphous Germanium Film," Oki et al.

Technology Information Association, "Thermo-Auto-Chrome Full Color Recording Technology," May 31, 1995.

Caune et al., "Combined CW Laser and Furnace Annealing of Amorphous Si and Ge in Contact With Some Metals," Jan. 1, 1989, pp. 597-604, Applied Surface Science, vol. 36.

Stoemnos et al., "Crystallization of Amorphous Silicon by Reconstructive Transformation Utilizing Gold," Mar. 18, 1991, pp. 1196-1198, Appl. Phys. Lett. 58(11).

Kakkad et al., "Crystallized Si-Films By Low-Temperature Rapid Thermal Annealing of Amorphous Silicon," Mar. 1, 1989, pp. 2069-2072, J. Appl. Phys. 65(5).

Oki et al., "Effect of Deposited Metals On The Crystallization Temperature of Amorphous Germanium Film," 1969, pp. 1056, Jpn. J. Appl. Phys. 8.

Kuznetsov et al., "Enhanced Solid Phase Epitaxial Recrystallization of Amorphous Silicon Due to Nickel Silicide Precipitation Resulting From Ion Implantation and Annealing," 1993, pp. 990-993, Nucl. Instruments Methods Physics Research, 880/881.

Hayashi et al., "Fabrication of Low-Temperature Bottom Gate Poly-Si TFTs on Large Area Substrate by Linear-Beam Excimer Laser Crystallization and Ion Doping Method," Jan. 1, 1995, pp. 829-832, IEEE IEDM.

Takenaka et al., "High Mobility Poly-Si Thin Film Transistors Using Solid Phase Crystallized a-Si Films Deposited by Plasma Enhanced Chemical Vapor Deposition," Dec. 1990, pp. L2380-L2383, Jpn. J. Appl. Phys. vol. 29, No. 12.

Hatalis et al., "High Performance Thin-Film Transistors in Low Temperature Crystallized LPCVD Amorphous Silicon Films," Aug. 1987, pp. 361-364, Elec. Dev. Letters vol. EDL 8, No. 8.

Zorabedian et al., "Lateral Seeding of Silicon-on-Insulator Using an Elliptical Laser Beam: A Comparison of Scanning Methods," 1984, pp. 81-86, Mat. Res. Soc. Symp. Proc. vol. 33.

Green et al., "Method to Purify Semiconductor Wafers," Oct. 1973, pp. 1612-1613, IBM Tech. Discl. Bulletin, vol. 16, No. 5.

Boyd, et al., "Oxidation of Silicon Surfaces by $CO_2$ Lasers," Jul. 15, 1982, pp. 162-164, Applied Phys. Letters, vol. 41, No. 2.

Wolf et al., "Silicon Processing for the VLSI Era Vol. 1: Process Technology," 1986, pp. 215-216, Lattice Press.

Lau et al., "Solid Phase Epitaxy in Silicide Forming System," 1977, pp. 313-322, Thin Solid Films, 47.

Kawazu et al., "Low-Temperature Crystallization of Hydrogenated Amorphous Silicon Induced by Nickel Silicide Formation," Dec. 1990, pp. 2698-2704, Inst. Of Appl. Phys. vol. 29, No. 12.

Wolf et al., "Silicon Processing for the VLSI Era vol. 1: Process Technology," 1986, pp. 550-551, Latice Press.

Bruines et al., "Between Explosive Crystallization and Amorphous Regrowth: Inhomogeneous Soldification Upon Pulsed Laser Annealing of Amorphous Silicon," Mar. 1, 1987, pp. 507-509, Applied Physics Letter, vol. 50.

Kawazu et al., "Initial Stage of the Interfacial Reaction between Nickel and Hydrogenated Amorphous Silicon," Apr. 1, 1990, pp. 729-738, Japanese Journal of Appl. Phys., vol. 29.

Kakkad et al., "Low Temperature Selective Crystallization of Amorphous Silicon," 1989, pp. 66-68, Journal of Non-Crystalline Solids, 115.

Suresh et al., "Electroless Plated Nickel Contacts to Hydrogenated Amorphous Silicon," Jan. 1, 1994, pp. 78-81, Thin Solids Films, vol. 252.

Sakaguchi et al., "Current Progress in Epitaxial Layer Transfer," Mar. 1, 1997, pp. 378-387, IEICE Trans. Electron, vol. E80 C/No. 3.

Kouvatsos et al., "Fluorine-Enhanced Oxidation of Polycrystalline Silicon and Application to Thin-Film Transistor Fabrication," Aug. 24, 1992, pp. 937-939, Appl. Phys. Letter, vol. 61, No. 8.

Sze, "VLSI Technology," Jan. 1, 1988, pp. 397-400, McGraw-Hill Publishing Company, Second Edition.

Ghandhi, "VLSI Fabrication Principles," Jan. 1, 1983, pp. 419-429, Wiley and Sons.

Kuper et al., "Effects of Fluorine Implantation on the Kinetics of Dry Oxidation of Silicon," Aug. 1, 1986, pp. 985-990, J. Applied Physics.

Wolf et al., "Silicon Processing for the VLSI Era vol. 1: Process Technology," 1986, pp. 198-207, Lattice Press.

Thompson et al., "Silicide Formation in Pd-a-Si:H Schottky Barriers," Aug. 1981, pp. 274-276, Appl. Phys. Lett., vol. 39, No. 3.

Nemanich et al., "Initial Phase Formation at the Interface of Ni, Pd, or Pt and Si," 1984, pp. unknown, Mat. Res. Soc. Symp. Proc., vol. 25.

Nemanich et al., "Structure and Growth of the Interface of Pd on a-SiH," Jun. 15, 1981, pp. 6828-6831, the American Physical Society Physics Review, vol. 22, No. 12.

Hemple et al., "Needle-Like Crystallization of Ni Doped Amorphous Silicon Thin Film," 1993, pp. 921-924, Solid State Communications, vol. 85, No. 11.

Kuo, "Thin Film Transistor Technologies," vol. 94-35, pp. 116-122, The Electrochemical Society Proceedings.

Author Unknown, "Thermo Auto-Chrome Full Color Recording Technology," May 31, 1995, pp. Unknown, Technology Information Association.

Wolf et al., "Thermal Oxidation of Single Crystal Silicon," 1986, pp. 207-211, Silicon Processing for the VLSI Era.

Erokhin et al., "Spatially Confined Nickel Disilicide Formation at 400C on Ion Implantation Preamorphized Silicon," Dec. 6, 1993, pp. 3171-3175, Appl. Phys. Lett. 63 (23).

Dvurechenskii et al., "Transport Phenomena in Amorphous Silicon Doped by Ion Implantation of 3d Metals," 1986, pp. 635-640, Akademikian Lavrentev Prospekt 13, 630090 Novosibirsk 90, USSR.

Batstone et al., "Microscopic Processes in Crystallization," Jan. 1, 1994, pp. 257-268, Solid State Phenomena, vol. 37-38.

Cammarata et al., "Silicide Precipitation and Silicon Crystallization in Nickel Implanted Amorphous Silicon Thin Films," Oct. 10, 1990, pp. 2133-2138, J. Mater. Res. vol. 5, No. 10.

Hayzelden et al., "Silicide Formation and Silicide Mediated Crystallization of Nickel-Implanted Amorphous Thin Films," May 15, 1993, pp. 8279-8289, J. Appl. Phys. 73 (12).

Kuznetsov et al., "Silicide Precipitate Formation and Solid Phase Re-Growth of Ni-Implanted Amorphous Silicon," Apr. 5-8, 1993, pp. 191-194, Inst. Phys. Conf. Ser. No. 134.4: Proceedings of Royal Microscipical Society Conf.

Liu et al., "Polycrystalline Silicon Thin Film Transistors on Corning 7059 Glass Substrates Using Short Time, Low-Temperature Processings," May 17, 1993, pp. 2554-2556, Appl. Phys. Lett 62(20).

Liu et al., "Selective Area Crystallization of Amorphous Silicon Films by Low-Temperature Rapid Thernal Annealing," Aug. 14, 1989, pp. 660-662, Appl. Phys. Lett 55(7).

Spaepen et al., Metal-Enhanced Growth of Silicon, 1992, pp. 483-499, Crucial Issues in Semiconductor Materials & Processing Technologies.

IBM Technical Disclosure Bulletin, vol. 11, No. 7, A.R. Baker, Jr.

S.K. Ghandhi, VLSI Fabrication Principles, John Wiley & Sons, Inc., 1983, pp. 388-392.

M.K. Hatalis, et al., *High-Performance Thin Film Transistors in Low-Temperature Crystallized LPCVD Amorphous Silicon Films*, IEEE Electron Device Letters, vol. EDL-8, No. 8, Aug. 1987, pp. 161-164.

Official Action dated Aug. 3, 1998 for U.S. Appl. No. 08/784,293.

Official Action dated Feb. 11, 1999 for U.S. Appl. No. 08/784,293.

Official Action dated Jan. 17, 2003 for U.S. Appl. No. 08/784,293.

Kuper et al., *Effects of Fluorine Implantation on the Kinetics of Dry Oxidation of Silicon*, J. of Applied Physics, vol. 60, No. 3, Aug. 1, 1986, pp. 985-990.

Kuo, *Pd Induced Lateral Crystallization of Amorphous Silicon Thin Films at Low Temperature*, Thin Film Transistor Technologies, vol. 94-35, The Electrochemical Society Proceedings, Jan. 1994, pp. 116-122.

Dvurechenskii et al., *Transport Phenomena in Amorphous Silicon Doped by Ion Implantation of 3d Metals*, Akademikian Lavrentev Prospekt 13, vol. 95, 630090 Novosibirsk 90, USSR, 1986, pp. 635-640.

Hayzelden et al., *Silicide Formation and Silicide Mediated Crystallization of Nickel-Implanted Amorphous Silicon Thin Films*, J. Appl. Phys. 73(12), Jun. 15, 1993, pp. 8279-8289.

Wolf, S., *Silicon Processing for the VLSI Era*, vol. 2, 1990, pp. 273-274, 354, 356-357, and 359.

A.R. Baker Jr. et al., "Field Effect Transistor," IBM Technical Disclosure Bulleton, vol. 11, No. 7, p. 849, 1968.

Stoemenos et al., "Crystallization of Amorphous Silicon by Reconstructive Transformation Utilizing Gold," Mar. 18, 1991, pp. 1196-1198, Appl. Phys. Lett., 58(11).

Lau et al., "Solid Phase Epitaxy in Silicide Forming System," 1977, pp. 313-322, Thin Solid Films, vol. 47, No. 3.

Nemanich et al., "Structure and Growth of the Interface of Pd on a-SiH," Jun. 15, 1981, pp. 6828-6831, The American Physical Society Physics Review, vol. 23, No. 12.

Wolf et al., "Thermal Oxidation of Single Crystal Silicon," 1986, pp. 207-211, Silicon Processing for the VLSI Era, vol. 1.

Dvurechenskii et al., Phys. Stat. Sol. (A), "Transport Phenomena in Amorphous Silicon Doped by Ion Implantation of 3d Metals," Akademikian Lavrentev Prospekt 13, vol. 95, 630090 Novosibirsk 90, USSR, 1986, pp. 635-640.

Office Action (Appl. No. 200510067218.X) Dated Sep. 14, 2007.

Office Action (Appl. No. 200510065795.5) Dated Sep. 14, 2007.

Nemanich et al., "Structure and Growth of the Interface of Pd on a-SiH," Jun. 15, 1981, pp. 6828-6831, Physical Review B. vol. 23, No. 12.

* cited by examiner

INTRODUCTION OF Ni ELEMENT

CRYSTALLIZATION BY THERMAL PROCESSING

FORMATION OF THERMAL OXIDE FILM

REMOVAL OF THERMAL OXIDE FILM

100 μm

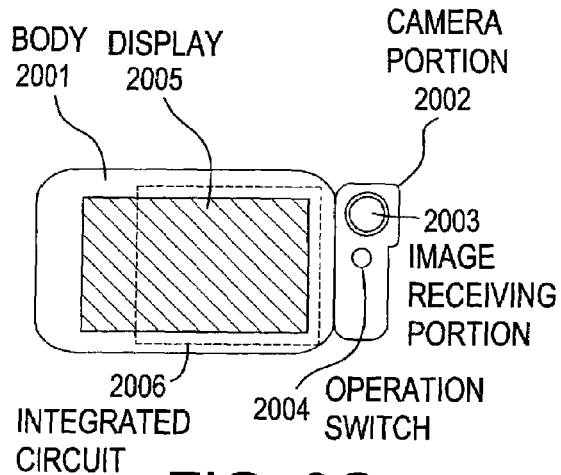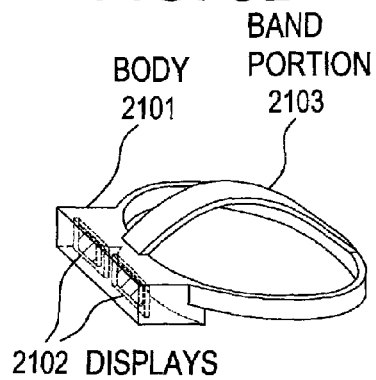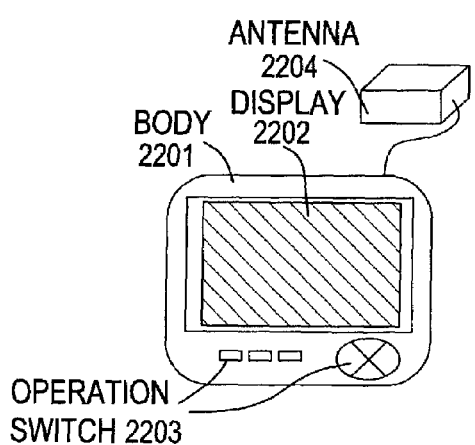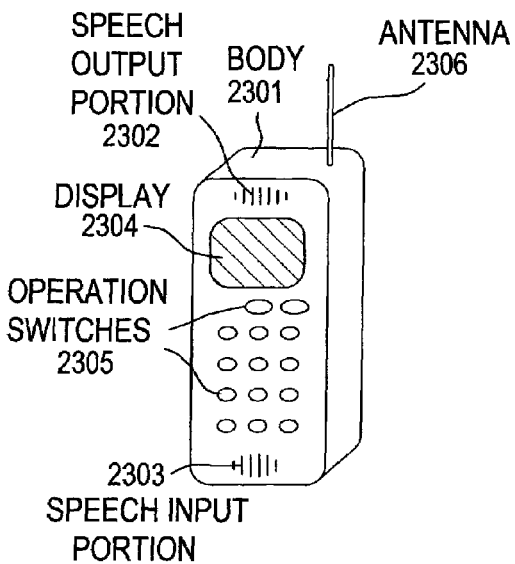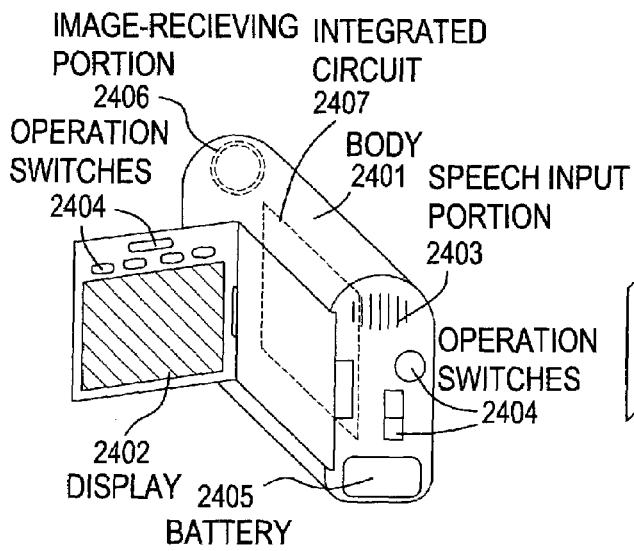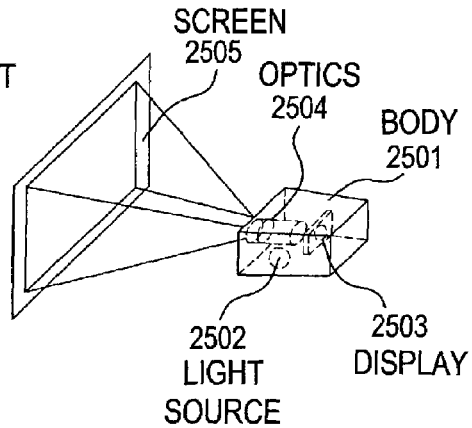

SEMICONDUCTOR ACTIVE REGION OF TFTS HAVING RADIAL CRYSTAL GRAINS THROUGH THE WHOLE AREA OF THE REGION

BACKGROUND OF THE INVENTION

1. Field of the Invention

The present invention relates to a thin-film semiconductor having crystallinity and also to a method of fabricating such a thin-film semiconductor. Furthermore, the invention relates to a semiconductor device utilizing such a thin-film semiconductor. In addition, the invention relates to a method of fabricating this semiconductor device.

2. Description of the Related Art

Techniques for forming a crystalline silicon film on a glass substrate or quartz substrate and fabricating thin-film transistors (TFTs) from this silicon film are known.

These TFTs are known as high-temperature polysilicon TFTs or low-temperature polysilicon TFTs.

High-temperature polysilicon TFT fabrication is a technique utilizing a heat treatment conducted at relatively high-temperatures such as 800° C., 900° C., and more, in fabricating crystalline silicon films. It can be said that this technique has derived from IC fabrication processes making use of single-crystal silicon wafers.

Of course, quartz substrates withstanding the above-described heating temperatures are used as substrates on which high-temperature polysilicon TFTs are formed.

On the other hand, low-temperature polysilicon TFTs are fabricated on cheaper glass substrates which are, of course, inferior in heat resistance to quartz substrates.

When a crystalline silicon film forming low-temperature polysilicon TFTs is fabricated, a heat treatment at a temperature lower than 600° C. is used so that the glass substrate can stand up to it, or laser annealing technique which hardly thermally damages the glass substrate is exploited.

High-temperature polysilicon TFT fabrication technology is characterized in that it can integrate TFTs having uniform characteristics on a substrate at a high density.

On the other hand, low-temperature polysilicon TFTs can make use of glass substrates which are cheap and can easily provide large areas.

It is to be noted that with the current technology, high-temperature polysilicon TFTs do not differ greatly from low-temperature polysilicon TFTs in characteristics. The slight differences between them are that high-temperature polysilicon TFTs are superior in production yield and uniformity of characteristics across the substrate while low-temperature polysilicon TFTs are superior in productivity and production cost.

With respect to the characteristics, both kinds of TFTs show mobilities of approximately 50 to 100 $cm^2/V$ s and S values of about 200 to 400 mV/dec ($V_D$=1 V).

These characteristics mean that these TFTs can operate at speeds about two orders of magnitude higher than those of TFTs using amorphous silicon. However, the characteristics of the high-temperature polysilicon TFTs are much inferior to those of MOS transistors using single-crystal silicon wafers. Generally, the S values of MOS transistors employing single-crystal silicon wafers are on the order of 60 to 70 mV/dec. Furthermore, their operating frequencies are 1-2 orders of magnitude higher than those of high- and low-temperature polysilicon TFTs.

At present, TFTs are used to integrate the active matrix circuit of an active matrix liquid crystal display and its peripheral driver circuit on the same substrate. That is, the active matrix circuit and peripheral driver circuit are fabricated from TFTs on the same substrate.

In this configuration, the source driver circuit of the peripheral driver circuit is required to operate considerably above 10 MHz. Today, however, with respect to a circuit composed of high- and low-temperature polysilicon TFTs, a margin of only several megahertz is given to the operating speed.

Accordingly, it is customary to multiplex the operation, so that a matrix-driven liquid crystal display is fabricated. However, this method has the disadvantage that stripes appear on the viewing screen due to subtle deviations of timing of multiplexing.

A conceivable forthcoming technique is to integrate oscillator circuits, D/A converters, A/D converters, and digital circuits for performing various kinds of image processing on the same substrate, in addition to the peripheral driver circuit including a shift register circuit and a buffer circuit.

However, it is necessary that the aforementioned oscillator circuits, D/A converters, A/D converters, and digital circuits for performing various kinds of image processing operate at higher frequencies than the peripheral driver circuit.

Therefore, it is substantially impossible to fabricate these circuits from the high- and low-temperature polysilicon TFTs obtained by the current techniques.

It is to be noted that an integrated circuit which consists of MOS transistors using a single-crystal silicon wafer and can be operated above 100 MHz has been put into practical use.

SUMMARY OF THE INVENTION

The invention disclosed herein is intended to provide TFTs capable of building a circuit which can be operated at the above-described high speeds (generally, more than tens of megahertz).

It is another object of the invention to provide TFTs having characteristics comparable to those of MOS transistors fabricated, using a single-crystal silicon wafer. It is a further object of the invention to provide means for fabricating these TFTs. It is a yet other object of the invention to provide a semiconductor device to which requisite functions are imparted by TFTs having such excellent characteristics.

A semiconductor device according to the present invention comprises a plurality of TFTs formed on a substrate having an insulating surface. The active layer of the TFTs is formed by a crystalline silicon film. This crystalline silicon film is formed by making use of crystals grown radially from a multiplicity of points.

This structure is obtained where the TFTs are fabricated, using the crystalline silicon film grown into morphologies shown in FIGS. 3 and 6.

Examples of substrates having insulating surfaces include glass substrates (which are required to withstand the process temperature), quartz substrates, and semiconductor substrates having insulating films formed thereon.

The above-described crystalline silicon film consisting of crystals grown radially from a multiplicity of points can be obtained by performing crystallization step, formation of a thermal oxide film, and removal of the thermal oxide film. The aforementioned crystallization is carried out by a heat treatment, using a metallic element (typified by nickel as described later) that promotes crystallization of silicon. The thermal oxide film described above is formed in an oxidizing ambient containing a halogen element.

Another semiconductor device according to the invention also comprises a plurality of TFTs formed on a substrate having an insulating surface. The active layer of the TFTs is formed by a crystalline silicon film. This crystalline silicon film is composed of a multiplicity of elongated crystalline structures grown in a certain direction. The widths of these crystalline structures range from dimensions comparable to the film thickness to 2000 Å. The certain direction differs among the individual TFTs.

More specifically, where a number of TFTs are manufactured, using the crystalline silicon film grown into the crystal morphologies shown in FIGS. 3 and 6, the crystal growth direction (the direction of anisotropy of the elongated structures) in the active layer forming the TFTs differs among the individual TFTs.

Of course, some TFTs have active layers having the same crystal growth direction but most of the TFTs adopt the above-described structure.

For example, if an active matrix circuit is made of a crystalline silicon film consisting of crystals grown into a morphology as shown in FIG. 3, numerous TFTs arranged in hundreds of devices x hundreds of devices achieve the above-described structure.

The crystalline silicon film used in the present invention disclosed herein consists of crystals which are continuous with each other in a certain direction, as shown in FIG. 8. These successive elongated crystal structures have widths ranging from dimensions comparable to the film thickness to about 2000 Å. These numerous crystal structures form regions which extend substantially parallel on opposite sides of grain boundaries.

Macroscopically, these crystal structures extend radially as shown in FIGS. 7 and 6.

A method according to the present invention comprises the steps of: forming an amorphous silicon film on an insulating surface; crystallizing the amorphous silicon film by the action of a metallic element that promotes crystallization of silicon to obtain a crystalline silicon film; performing thermal processing at 800-1100° C. in an oxidizing ambient containing a halogen element to form a first thermal oxide film on a surface of the crystalline silicon film; removing the first thermal oxide film; and forming a second thermal oxide film on the surface of the crystalline silicon film, whereby obtaining a final crystalline silicon film consisting of crystals grown radially from a multiplicity of points.

In the above-described method, in order to improve the quality of the final crystalline silicon film, it is important to make the total thickness of the first and second thermal oxide films greater than the thickness of the final crystalline silicon film.

This is because the formed thermal oxide films drastically improve the quality of the crystalline silicon film.

Nickel is used quite advantageously as the metallic element for promoting crystallization of silicon in terms of reproducibility and effects. Generally, one or more elements selected from the group consisting of Fe, Co, Ni, Ru, Rh, Pd, Os, Ir, Pt, Cu, and Au can be used as this metallic element.

Where nickel element is employed, the concentration of nickel finally remaining in the silicon film is approximately $1 \times 10^{14}$ to $5 \times 10^{18}$ atoms/cm$^3$. If the gettering conditions for the thermal oxide films are optimized, the upper limit of this concentration can be reduced to about $5 \times 10^{17}$ atoms/cm$^3$. The concentration can be measured by SIMS (secondary ion mass spectroscopy).

Generally, the lower limit of the nickel concentration is approximately $1 \times 10^{16}$ atoms/cm$^3$. That is, this amount of nickel is left behind because it is normally difficult to remove the effects of nickel adhering to the substrate or equipment if the cost is also taken into account. However, the concentration of the residues can be reduced further by cleaning the equipment to a higher level or improving the manufacturing processes.

Accordingly, where general manufacturing processes are adopted, the concentration of the remaining nickel element is about $1 \times 10^{16}$ to $5 \times 10^{17}$ atoms/cm$^3$.

During fabrication of a thermal oxide film, the metallic element moves into the thermal oxide film and so the concentration of nickel element in the direction of thickness of the obtained crystalline silicon film has a gradient or distribution.

Generally, it is observed that the concentration of the metallic element in the crystalline silicon film tends to increase toward the interface at which the thermal oxide film is formed. Furthermore, it is observed that depending on the conditions, the concentration of the metallic element tends to increase toward the substrate or buffer layer, i.e., toward the interface on the back side.

Where a halogen element is added to the ambient when a thermal oxide film is formed, this halogen element shows a concentration distribution similar to that of the metallic element. That is, the concentration distribution is such that the concentration increases toward the front surface and/or rear surface of the crystalline silicon film.

The thickness of the final crystalline silicon film according to the present invention is preferably set to 100 to 750 Å, more preferably 150 to 450 Å. By selecting the film thickness in this way, the crystalline structure shown in FIGS. 6-8 can be obtained more clearly and with improved reproducibility.

It is necessary that the thickness of the final crystalline silicon film be determined by taking account of the fact that the film thickness is reduced by the deposition of the thermal oxide film.

The crystalline silicon film described herein can be obtained by adopting the manufacturing steps described above. Furthermore, MOS TFTs utilizing the special features of the crystalline structure can be obtained.

Examples of the method of introducing the metallic element include application of a solution containing this metallic element, a method using a CVD process, methods relying on sputtering or deposition, a plasma processing method using an electrode containing this metal, and a method making use of gas adsorption.

A method of introducing a halogen element can use a means for adding HCl, HF, HBr, Cl$_2$, F$_2$, Br$_2$, or CF$_4$ to an oxidizing ambient such as oxygen ambient.

Furthermore, when the thermal oxide film is fabricated, if hydrogen gas is also introduced into the ambient to make use of the action of wet oxidation, then desirable results arise.

The temperature at which the thermal oxide film is grown is quite important. If one attempts to obtain a TFT which can be operated by itself at tens of megahertz or more and shows an S value of less than 100 mV/dec as described later, then it is necessary to set the heating temperature used during the formation of the thermal oxide film above 800° C., more preferably 900° C. or above.

The upper limit of this heating temperature should be set to about 1100° C. which is the maximum processing temperature of quartz substrates.

The present invention lies in a technique for crystallizing an amorphous silicon film by means of heating to obtain a crystalline silicon film. This technique is characterized in that thermal processing is performed while holding nickel element in contact with the surface of the amorphous silicon film, thus giving rise to the crystalline silicon film. A thermal oxide film is formed on the surface of this crystalline silicon film by performing thermal processing at 800-1100° C. in an oxidizing ambient containing a halogenic element.

Thus, a crystalline silicon film grown into the peculiar crystalline state as shown in FIGS. 6-8 can be obtained.

BRIEF DESCRIPTION OF THE DRAWINGS

FIGS. 9(A)-9(F) are views schematically showing semiconductor devices according to the present invention.

DETAILED DESCRIPTION OF THE PREFERRED EMBODIMENTS

Embodiment 1

Figure 6:
FIG. 6 is an electron micrograph of a thin silicon film.

The present embodiment relates to a method of obtaining a crystalline silicon film grown into a peculiar morphology as shown in FIG. 6, by introducing a metallic element for promoting crystallization of silicon into the whole surface of an amorphous silicon film.

The process sequence of the present invention is shown in FIGS. 1(A)-1(D). First, a silicon oxide film is formed as a buffer layer 202 on a quartz substrate 201 to a thickness of 3000 Å. If the surface of this quartz substrate has excellent flatness and is cleaned sufficiently, then this buffer layer 202 may be dispensed with.

At present, it is desired to use the quartz substrate. However, the material of the substrate is not limited to quartz as long as the substrate is capable of withstanding the heating temperature during the thermal processing. For instance, a semiconductor substrate having an oxide film deposited thereon may also be used.

Then, an amorphous silicon film 203 acting as a starting film for a crystalline silicon film is formed to a thickness of 500 Å by LPCVD.

Thereafter, nickel acetate solution containing 10 ppm (weight-converted value) of nickel element is applied. Then, a spin-drying process is carried out, using a spinner (not shown), to remove a surplus of solution.

Figure 1A:
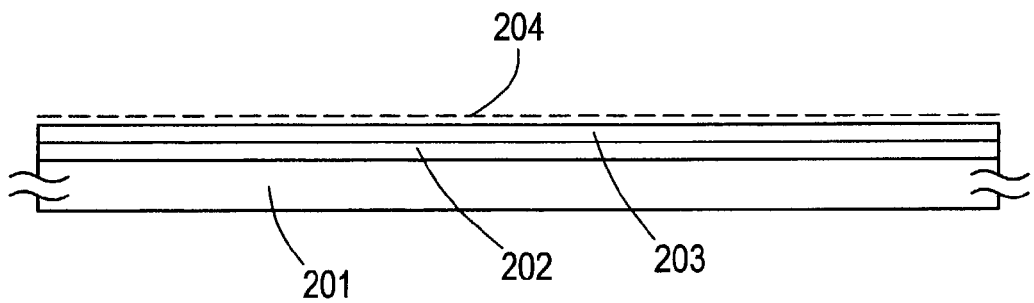
FIGS. 1(A)-1(D) are views illustrating a process sequence for fabricating a TFT.

In this way, nickel elements are present as shown by the dotted line 204 in FIG. 1(A) to obtain a state shown in FIG. 1(A).

Among methods of introducing nickel, the above-described method using the solution is excellent in controllability of the introduced amount and reproducibility. However, a metallic element (typified by nickel) for promoting crystallization of silicon may be introduced by a method using a CVD process, sputtering, plasma processing, gas adsorption, or other method.

Figure 1B:
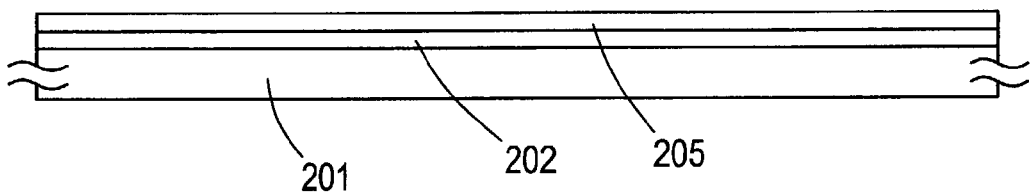
Figure 1C:
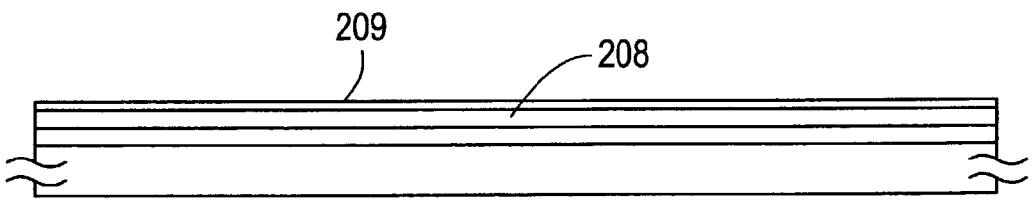

Then, thermal processing is conducted at 600° C. for 8 hours in a nitrogen ambient which contains 3% hydrogen but contains a minimum amount of oxygen. As a result of this thermal processing, crystallization proceeds. Consequently, a crystalline silicon film 205 shown in FIG. 1(B) is derived.

This thermal processing for crystal growth can be carried out at 450-1100° C. The upper limit of this temperature range is restricted by the heat resistance of the substrate. If some lateral growth distance should be secured, it is desired to set the heating temperature used in the heating processing to 600° C. or above. However, elevating the temperature further does not increase the crystal growth distance and crystallinity so much.

After the crystallization relying on this heating, laser light irradiation may be performed. That is, the crystallization may be promoted further by laser light irradiation. This irradiation acts to disperse nickel element clusters existing in the film. This will facilitate removing the nickel element later. Even if laser light irradiation is effected at this stage, lateral growth will no longer proceed.

The laser light can be emitted by an excimer laser having a wavelength lying in the UV range. For example, a KrF excimer laser (producing a wavelength of 248 nm) or XeCl excimer laser (producing a wavelength of 308 nm) can be exploited.

After the end of the thermal processing for the crystallization, a heat treatment is done at 950° C. in an oxygen ambient containing 3% by volume of HCl. During this step, a thermal oxide film 209 is formed to a thickness of 200 Å on the surface of the crystalline silicon film 205 (FIG. 1(C)).

As a result of the formation of this thermal oxide film, the thickness of the crystalline silicon film 208 decreases by about 100 Å. That is, the thickness of the silicon film assumes a value of approximately 400 Å.

During this step, as the thermal oxide film is formed, silicon element having unstable bonds in the film is used for the formation of the thermal oxide film. Defects in the film decrease, so that better crystallinity can be obtained.

At the same time, nickel element is gettered out of the film because of the formation of the thermal oxide film and by the action of chlorine.

Of course, a relatively high dose of nickel elements gets incorporated into the thermal oxide film 209 formed by this step. The relative concentration of nickel element within the silicon film 208 decreases.

After the formation of the thermal oxide film 209, it is removed. In this way, the crystalline silicon film 208 less doped with nickel element is obtained (FIG. 1(D)).

In the crystalline silicon film obtained in this manner, crystals are grown radially from many local regions (many points) as shown in FIG. 6, which is a photograph of an enlarged image obtained by an optical microscope.

Figure 7:
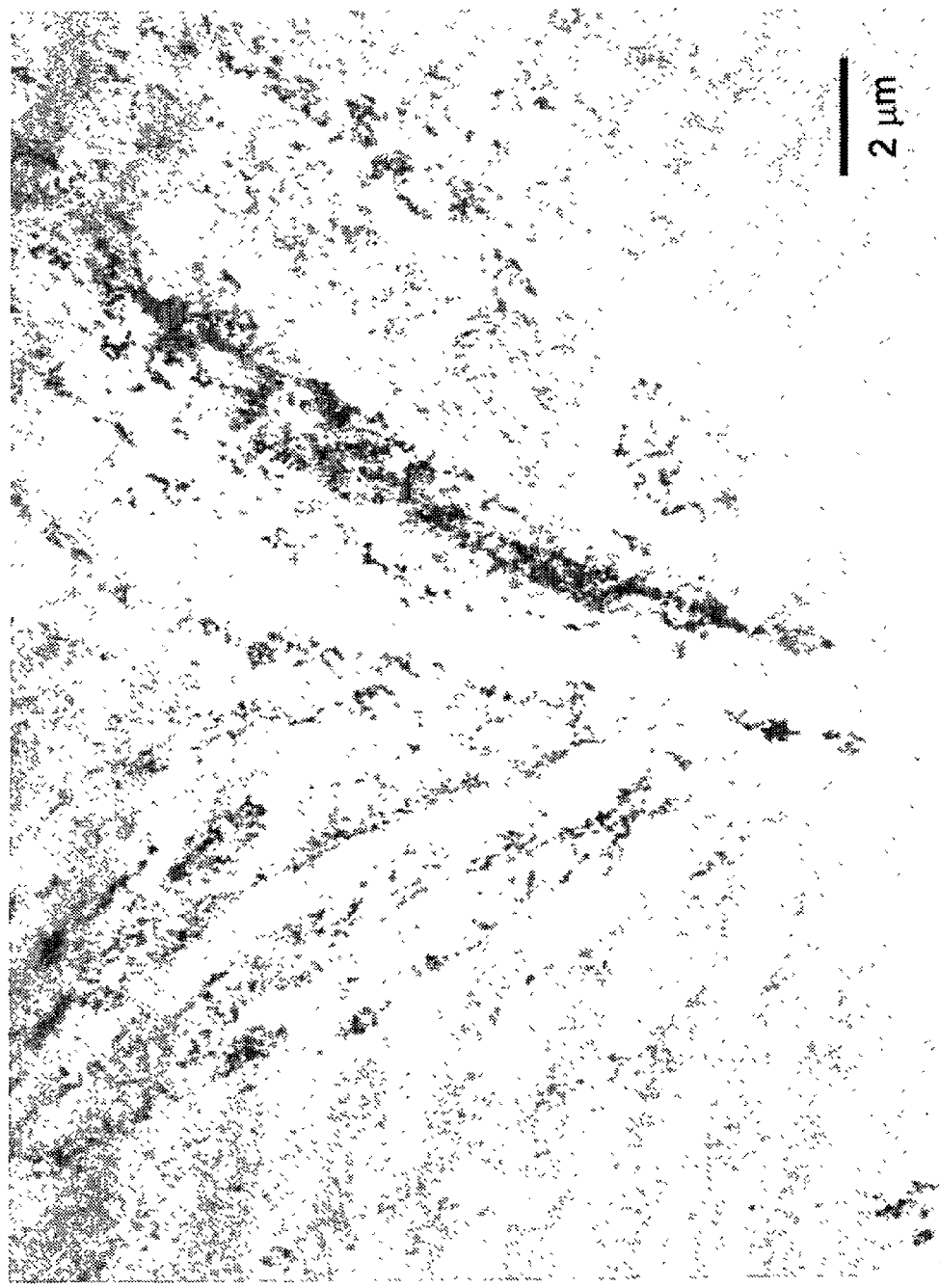
FIG. 7 is an electron micrograph of another thin silicon film.

FIG. 7 is an enlargement of a part of FIG. 6, and is a photograph take by a TEM (transmission electron microscope).

In this crystalline structure, grain boundaries extend in the direction in which crystals are grown radially. Also, crystalline structures are continuous with each other in this direction. It is confirmed that the continuity of crystal lattices is substantially maintained in this direction.

Figure 3:
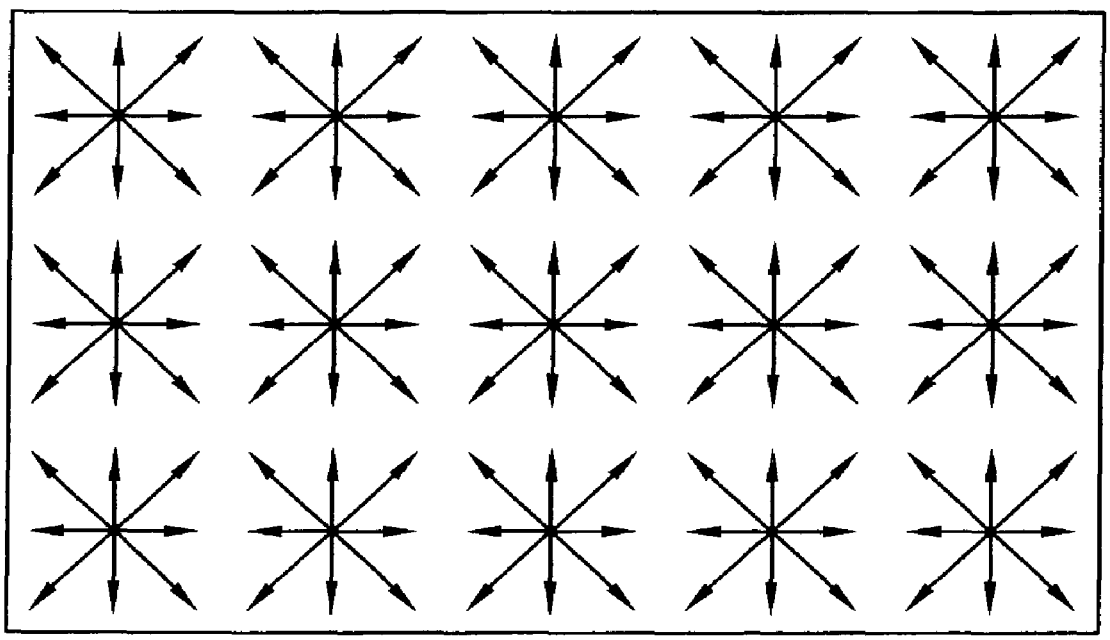
FIG. 3 is a diagram conceptually illustrating the state of grown crystals.
Figure 8:
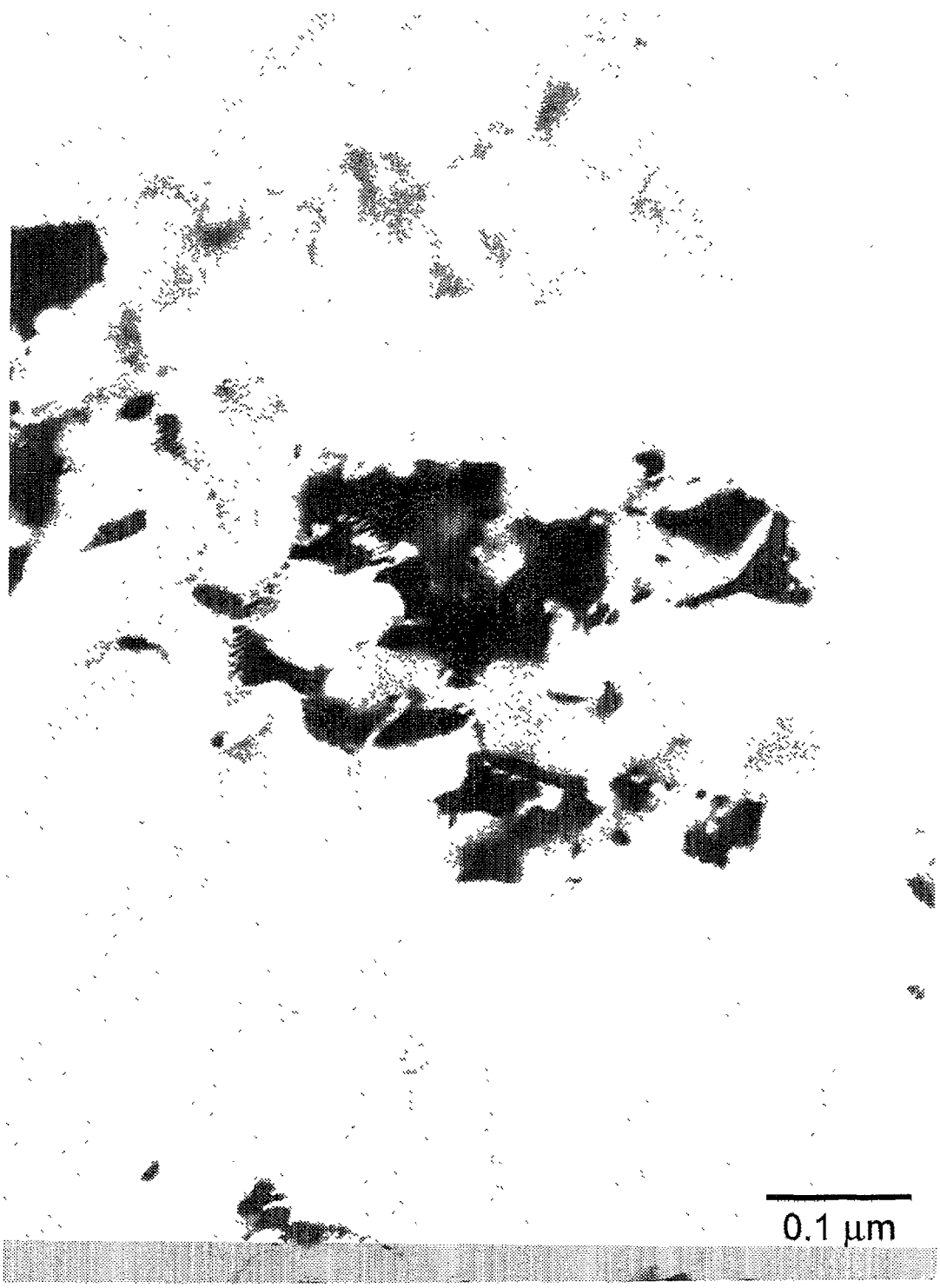
FIG. 8 is an electron micrograph of a further thin silicon film.

FIG. 8 is an enlargement of a part of FIG. 7, and is a photograph of an image observed with a TEM. FIG. 3 pictorially shows the state of crystals grown over the whole film.

In this obtained crystalline silicon film, the crystalline structures extend in one direction which is coincident with the crystal growth direction, as shown in FIGS. 6 and 7. That is, a plurality of crystalline columns are arranged parallel on opposite sides of grain boundaries extending in one direction.

These successive crystalline columns have widths ranging from dimensions comparable to the film thickness to approximately 2000 Å. Microscopically, they form regions extending substantially parallel on opposite sides of grain boundaries extending in a certain direction that is substantially coincident with the direction in which the above-described crystalline columns are continuous with each other.

Figure 1D:
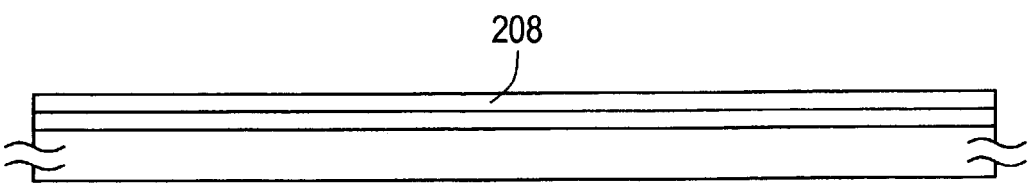

After the thermal oxide film 209 is removed and the crystalline silicon film 208 as shown in FIG. 1(D) is obtained, a patterning operation is carried out to create a pattern 302 consisting of laterally grown regions. These islands of region 302 will become an active layer for a TFT later.

Figure 2A:
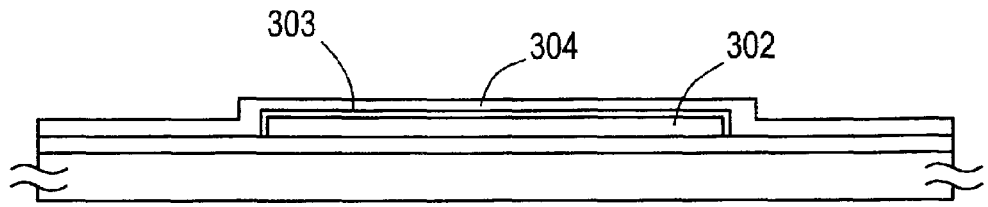
FIGS. 2(A)-2(E) are views illustrating a process sequence for fabricating a TFT.

Then, as shown in FIG. 2(A), after the formation of the pattern 302, a silicon oxide film 304 is formed to a thickness of 1000 Å by plasma CVD. This silicon oxide film 304 will act as a gate-insulating film later.

After forming the silicon oxide film 304, a heat treatment is performed at 950° C. in an oxygen ambient containing 3% HCl to form a thermal oxide film 303 having a thickness of 300 Å. This thermal oxide film is formed on the surface of the pattern 302 becoming the active layer, as shown in FIG. 2(A).

As a result of the thermal oxide film 211, the thickness of the pattern 302 becoming the active layer reaches 250 Å.

If a TFT of higher performance should be obtained, it is desired that the thermal oxide film 303 be thicker than the crystalline silicon film forming the active layer.

In general, it is important that the total thickness of the thermal oxide films 209 and 303 be greater than the thickness of the finally obtained active layer.

This thermal oxide film 211 forms parts of the gate-insulating film. In this way, a state shown in FIG. 2(A) is obtained.

Then, an aluminum film forming gate electrodes is formed to a thickness of 4000 Å by sputtering. This aluminum film contains 0.2% by weight of scandium.

The incorporation of the scandium in the aluminum film is intended to suppress generation of hillocks and whiskers at later processing steps. The hillocks and whiskers are needle-like or prickle-like protrusions due to overgrowth of aluminum during heating.

After the formation of the aluminum film, a dense anodic oxide film (not shown) is formed. For this purpose, an anodization process is carried out, using ethylene glycol solution containing 3% tartaric acid. The aluminum film is used as an anode, and a cathode of platinum is also employed. In this step, the dense anodic oxide film is formed to a thickness of 100 Å on the aluminum film.

This anodic oxide film (not shown) serves to improve the adhesion to a resist mask formed later.

The thickness of this anodic oxide film can be controlled by the voltage applied during the anodization.

Figure 2B:
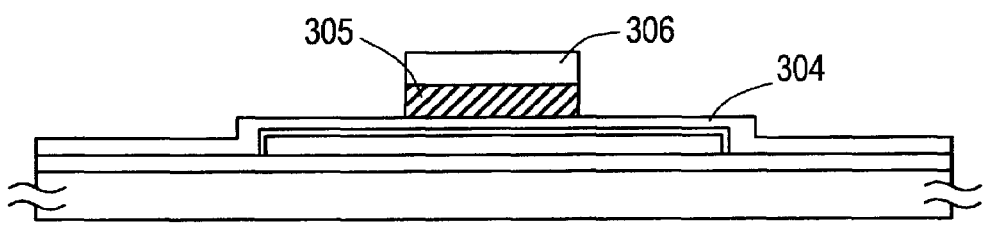

Then, the resist mask, indicated by 306, is formed. The aluminum film is patterned into stripes 305, utilizing this resist mask. As a result, a state shown in FIG. 2(B) is obtained.

Anodization is again effected. During this step, 3% aqueous solution of oxalic acid is used as an electrolytic solution, within this electrolytic solution, the anodization is carried out, using the aluminum pattern 305 as an anode. Consequently, a porous anodic oxide film 308 is formed (FIG. 2(C)).

In this step, the anodic oxide film 308 is formed selectively on the side surface of the aluminum pattern because the resist mask 306 adhering well exists thereon.

This anodic oxide film can be grown to a thickness of several micrometers. In this embodiment, the film thickness is set to 6000 Å. The growth distance can be controlled by the anodization time.

Then, the resist mask 306 is removed. Subsequently, another dense anodic oxide film is formed. In particular, anodization is again performed, using an electrolytic solution consisting of the aforementioned ethylene glycol solution containing 3% tartaric acid.

During this step, the electrolytic solution intrudes into the porous anodic oxide film 308 and so a dense anodic oxide film 309 is formed.

The thickness of this dense anodic oxide film 309 is set to 1000 Å. This film thickness is controlled by the applied voltage.

Then, the exposed silicon oxide film 304 is etched away. At the same time, the thermal oxide film 303 is etched by dry etching techniques.

The remaining, CVD-grown silicon oxide film is indicated by 310. A thermal oxide film of the similar shape is left behind under the left silicon oxide film.

Figure 2C:
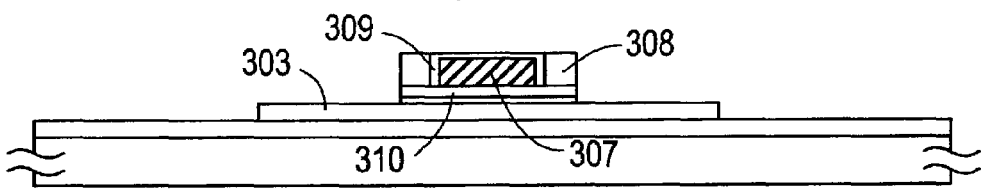

In this way, a state shown in FIG. 2(C) is obtained. The porous anodic oxide film 308 is removed, using mixed acid of acetic, nitric, and phosphoric acids. In this manner, a state shown in FIG. 2(D) results.

Figure 2D:
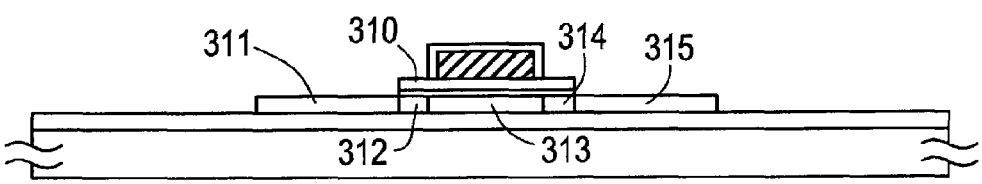

After obtaining the state shown in FIG. 2(D), dopant ions are implanted. In this embodiment, phosphorus (P) ions are introduced by plasma doping.

During this step, heavily doped regions 311, 315 and lightly doped regions 312, 314 are formed, because the remaining silicon oxide film 310 acts as a semi-transparent mask (a semi-blocking mask) and block some of the implanted ions.

Laser light or other intense light from a lamp is irradiated to activate the dopant ion-implanted regions. In this way, the source region 311, a channel-forming region 313, the drain region 315, and lightly doped regions 312, 314 are formed by self-aligned technology.

The region 314 is a lightly doped drain (LDD) region (FIG. 2(D)).

Where the thickness of the dense anodic oxide film 309 is increased to 2000 Å or more, this great thickness permits formation of an offset gate region outside the channel-forming region 313.

Also in the present invention, an offset gate region is formed but its dimensions are small. Hence, the contribution of the offset gate region is small and not shown for simplicity.

When the dense anodic oxide film is made as thick as 2000 Å or more, it is necessary to apply a voltage of more than 200 V. Hence, care must be taken to secure sufficient reproducibility and safety.

After obtaining the state shown in FIG. 2(D), a silicon nitride film 300 is formed as an interlayer dielectric film by plasma CVD. Then, a polyimide resin film 316 is formed by spin coating.

Figure 2E:
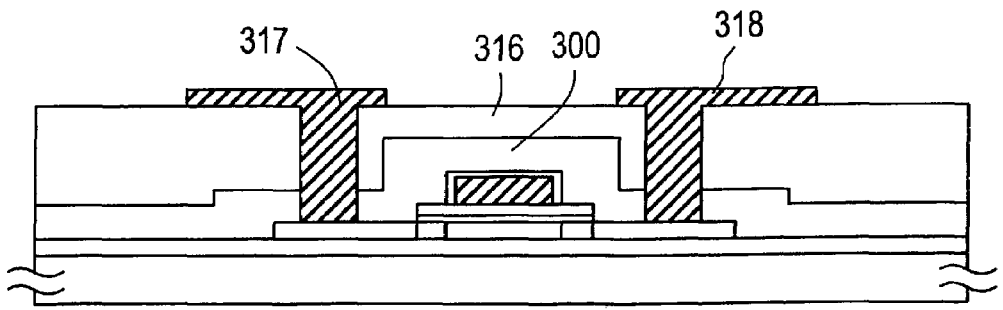

Thereafter, a contact hole is formed. A source electrode 317 and a drain electrode 318 are formed. In this way, a TFT shown in FIG. 2(E) is completed.

The TFT of the present embodiment shows unparalleled characteristics.

For example, a high-performance NTFT (N-channel TFT) having a mobility of 200 to 300 cm$^2$/V s and an S value of 75 to 90 mV/dec ($V_D$=1 V) is obtained. Furthermore, a high-performance PTFT (P-channel TFT) having a mobility of 120 to 180 cm$^2$/V s and an S value of 75 to 100 mV/dec ($V_D$=1 V) is derived.

Especially, these S values are less than half of those of the conventional high-temperature and low-temperature polysilicon TFTs. That is, these are surprisingly excellent values.

Using these TFTs, an operational amplifier, memory circuits, various kinds of arithmetic circuits and amplifiers can be formed on a quartz substrate.

Embodiment 2

The present embodiment shows processing steps for fabricating the active matrix circuit portion of an active matrix liquid crystal display.

The process sequence of the present embodiment is schematically shown in FIGS. 4(A)-4(D). A crystalline silicon film and a liquid crystal display are fabricated by the fabrication steps described in Embodiment 1. A state shown in FIG. 2(D) (FIG. 4(A)) is obtained by the fabrication steps shown in FIGS. 1(A)-1(D) and 2(A)-2(D).

Figure 4A:
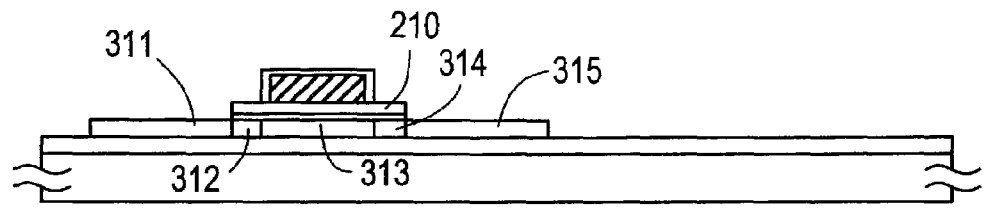
FIGS. 4(A)-4(D) are views illustrating a process sequence for fabricating a TFT.
Figure 4B:
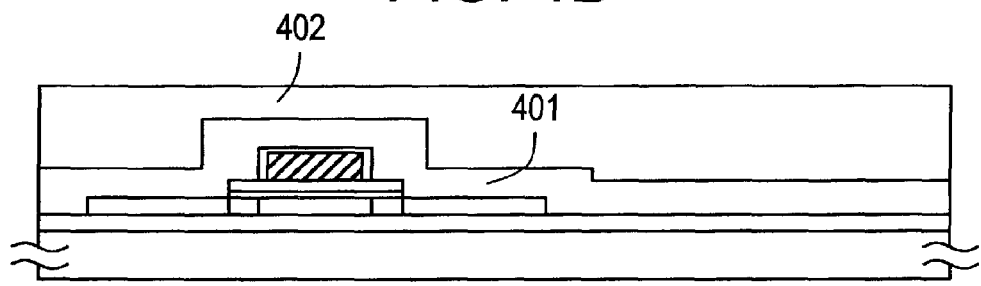

After obtaining the state shown in FIG. 4(A), a silicon nitride film 401 is formed as a first interlayer dielectric film to a thickness of 2000 Å by plasma CVD. Then, a polyimide resin film 402 is spincoated. Thus, a state shown in FIG. 4(B) is obtained. Polyamide and polyimideamide can be used as resinous materials, as well as polyimide.

Then, contact holes extending to the source region 311 and to the drain region 315 are formed. A source electrode 403 and a drain electrode 403 are created. These electrodes are fabricated from a Ti—Al—Ti lamination film. The source electrode 403 is formed so as to extend from a source line (FIG. 4(C)).

Portions of the drain electrode 403 are employed as electrodes for forming an auxiliary capacitor.

Figure 4C:
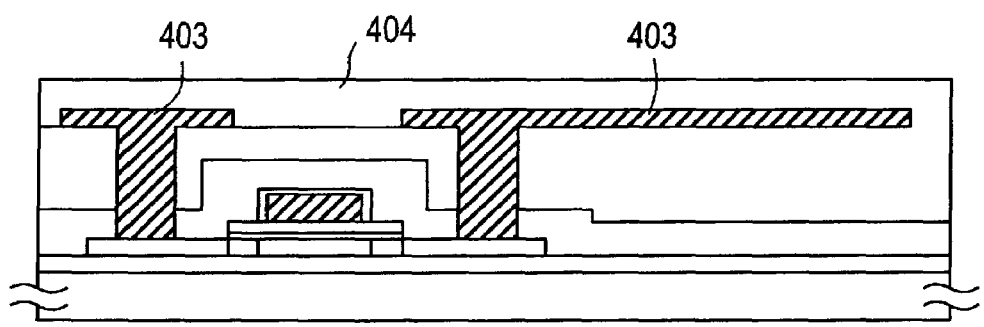
Figure 4D:
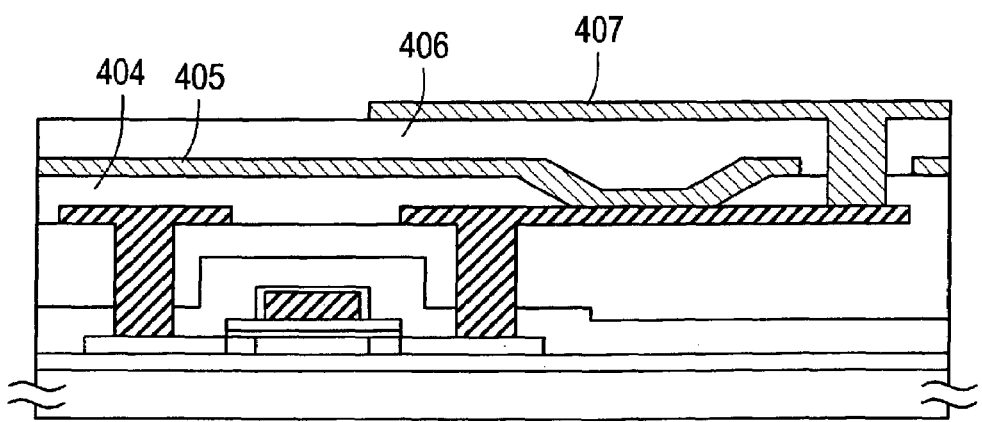

After forming the source and drain electrodes, a polyimide resin film 404 is formed as a second interlayer dielectric film. Thus, a state shown in FIG. 4(C) is derived.

Then, a window is formed in the resinous interlayer dielectric film 404. A black matrix (BM) 405 is fabricated from a lamination film of titanium and aluminum. Inherently, this black matrix 405 acts as a light-shielding film. Besides, this black matrix serves as electrodes forming auxiliary capacitors.

After forming the black matrix 405, a polyimide resin film 406 is formed as a third interlayer dielectric film. A contact hole that permits access to the drain electrode 403 is formed. A pixel electrode pattern 407 is formed from ITO.

The pattern of the black matrix 405 overlaps the pattern of the pixel electrode 407 via the polyimide resin film 406, thus forming the auxiliary capacitors.

Embodiment 3

The present embodiment is similar to Embodiment 1 except that contacts are formed either on gate electrodes or on gate interconnects extending from the gate electrodes by a novel method.

In Embodiment 1, the side and top surfaces of the gate electrodes are coated with the dense anodic oxide film.

Where the electrodes are fabricated from aluminum, this structure is very effective in suppressing hillocks and shorts between conductive interconnects.

However, the densification of the film makes it relatively difficult to form contacts.

The present embodiment relates to a structure for solving this problem. The process sequence of the present embodiment is shown in FIGS. 5(A)-5(E). It is to be noted that like components, including details of fabrication conditions, are indicated by like reference numerals in various figures.

Figure 5A:
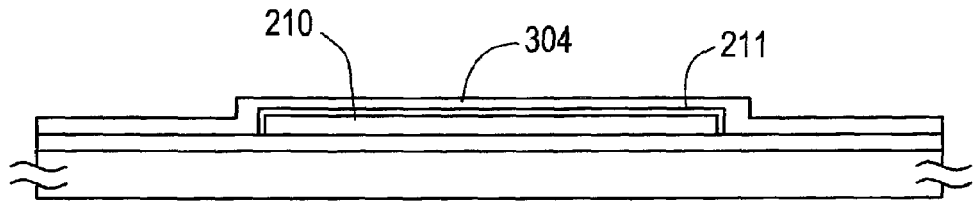
FIGS. 5(A)-5(E) are views illustrating a process sequence for fabricating a TFT.

First, as shown in FIG. 5(A), an active layer pattern 210 is formed from a crystalline silicon film. A lamination layer consisting of a thermal oxide film 211 and a CVD-grown oxide film 304 is formed thereon.

In this embodiment, the CVD-grown oxide film is first formed, followed by formation of the thermal oxide film.

After obtaining the state shown in FIG. 5(A), an aluminum film is formed, and a silicon nitride film is formed to a thickness of 500 Å. The laminate is patterned, using a resist mask 306. As a result, an aluminum pattern 305 and an overlying silicon nitride film pattern 501 are formed (FIG. 5(B)).

Figure 5B:
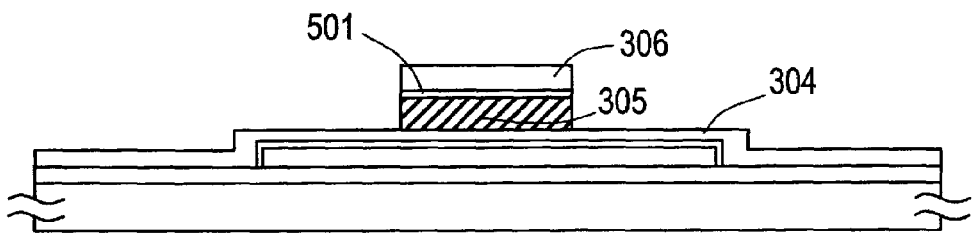

After obtaining the state shown in FIG. 5(B), a porous anodic oxide film 308 is formed while leaving the resist mask 306 behind. A denser anodic oxide film 309 is formed.

These anodic oxide films are formed selectively only on the side surfaces of the aluminum pattern 307 becoming gate electrodes, because the top surface of the aluminum pattern is capped with the silicon nitride film 501.

After the formation of the anodic oxide film, the resist mask 306 is removed. The exposed silicon oxide film 304 is also removed. The thermal oxide film 211 is partially removed.

Figure 5C:
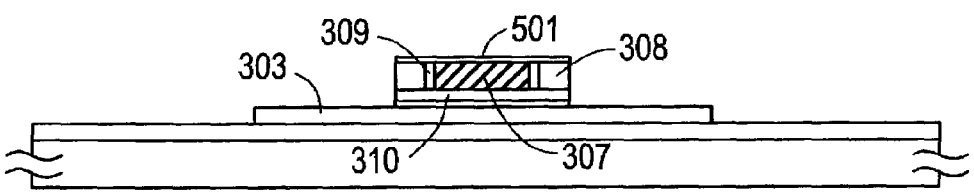

In this way, a state shown in FIG. 5(C) is obtained. Then, the resist mask 306 is removed, and the porous anodic oxide film 308 is removed.

Subsequently, the silicon nitride film 501 is removed. This results in a state shown in FIG. 5(D). Under this condition, a dopant that imparts a conductivity type is implanted by plasma doping.

As a result, a source region 311, lightly doped regions 312, 314, a channel region 313, and a drain region 315 are formed by self-aligned technology.

After the dopant doping, laser light irradiation is performed to anneal out the damage caused by the doping and to active the introduced dopant.

Figure 5D:
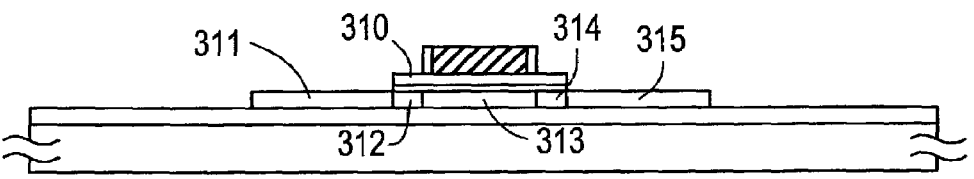
Figure 5E:
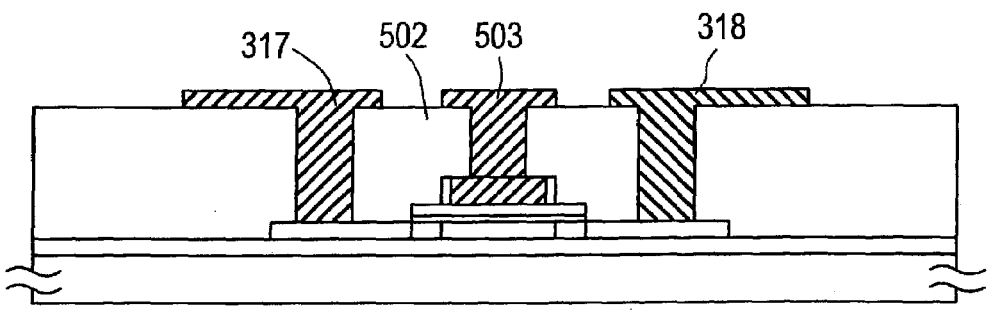

In this way, a state shown in FIG. 5(D) arises. Then, an interlayer dielectric film 502 is formed. A contact hole is formed. A source electrode 317, an electrode 503 extending from the gate, and a drain electrode 318 are formed. Thus, a state shown in FIG. 5(E) is obtained.

During this step, the formation of the contact hole extending to the gate electrode 307 can be performed relatively easily because no anodic oxide film resides on top of the gate electrode.

Source/drain electrodes and gate electrode are shown to be formed on the same cross section but, in practice, the electrode 503 is formed on a part of the gate electrode 307 extending from the gate electrode 307.

Embodiment 4

The present embodiment is an improvement over the configuration of Embodiment 3. In the present embodiment, a titanium film is grown on the aluminum film forming the gate electrode. A silicon nitride film is formed on the titanium film.

In particular, in a configuration shown in FIG. 5(B), the film 501 is made of a lamination film of titanium and silicon nitride. This can suppress generation of hillocks on the top surface of the aluminum electrode in later processing steps.

Embodiment 5

The present embodiment is similar to Embodiment 1 except that the substrate is made of glass.

In the present embodiment, the substrate is made of Corning 1737 glass having a strain point of 667° C. A heat treatment is made at 600° C. for 4 hours for crystallization.

A heat treatment for formation of a thermal oxide film is carried out at 640° C. in an oxygen ambient containing 3% by volume of HCl. In this case, the thickness of the thermal oxide film formed reaches about 30 Å if the processing time is 2 hours. The resulting effect is smaller compared with the case where a heat treatment at 950° C. is added as in Embodiment 1.

Embodiment 6

The present embodiment is similar to Embodiment 1 except that the ambient in which the thermal oxide film is formed does not contain HCl. In this case, the gettering effect of nickel is smaller than in the case where the ambient contains HCl.

Embodiment 7

The present embodiment is similar to Embodiment 1 except that laser light irradiation is carried out after the formation of the thermal oxide film. This can promote the crystallization further.

Embodiment 8

The present embodiment shows examples of semiconductor device making use of TFTs. These various examples of semiconductor device are shown in FIGS. 9(A)-9(F).

Referring to FIG. 9(A), there is shown a portable intelligent terminal whose body is indicated by 2001. The body comprises an active matrix liquid crystal display 2005 including a memory. Required information can be read from the internal memory and displayed on the display 2005. Furthermore, information accessed through a telephone line can be displayed on the display 2005.

It can be considered that the display device is an active matrix electroluminescent device. Various information-processing circuits and storage circuits are fabricated as an integrated circuit 2006, using TFTs, on the same substrate as the active matrix circuit forming the display device.

The body 2001 is equipped with a camera portion 2002. Required image information can be picked up by operating an operation switch 2004. The image picked up by the camera portion 2002 is accepted into the instrument through an image-receiving portion 2003.

Referring next to FIG. 9(B), there is shown a head mounted display whose body is indicated by 2101. A user puts on this body 2101. This display unit has two active matrix liquid crystal displays 2102 which act to display images in a location several centimeters away from the user's eyes. This instrument permits virtual reality visualization.

Referring next to FIG. 9(C), there is shown a car navigational system. This system acts to measure positions, using signals from an artificial satellite, the signals being received by an antenna 2204. The measured positions are displayed on an active matrix liquid crystal display 2202. The displayed information is selected with an operation switch 2203.

Instead of the liquid crystal display, an active matrix electroluminescent display can be utilized.

An example of mobile telephone is shown in FIG. 9(D). The body of this apparatus is indicated by 2301 and equipped with an antenna 2306. The apparatus has a speech input portion 2303 and a speech output portion 2302.

When the user telephones, operation switches 2305 are operated. Various kinds of image information are displayed on a display unit 2304. To make the display unit portable, an active matrix liquid crystal display or active matrix electroluminescent display is employed.

Shown in FIG. 9(E) is a portable video camera whose body is indicated by 2401. This apparatus has an image-receiving portion 2406 for picking up an image. This image is stored in a magnetic tape loaded in the body 2401.

An integrated circuit 2407 performs various kinds of digital processing on the image. This integrated circuit 2407 may be a combination of conventional ICs chips or a combination of TFTs disclosed herein. Furthermore, these two types of devices may be combined.

The image received by the image-receiving portion 2406 or stored in the internal magnetic tape is displayed on the active matrix liquid crystal display 2402. The apparatus is controlled with operation switches 2404 and powered by a battery 2405.

Shown in FIG. 9(F) is a projection display system whose body is indicated by 2501. An image projected by the body 2501 is displayed on a screen.

The body 2501 comprises a light source 2502, an active matrix liquid crystal display 2503 for optically modulating the light from the light source and forming an image, and optics 2504 for projecting the image.

Excluding the apparatus shown in FIG. 9(B), the liquid crystal display can be either transmission type or reflection type.

Where a 9-stage ring oscillator is built by combining PTFTs and NTFTs obtained by making use of the invention disclosed herein, oscillations above 400 MHz are possible.

Generally, an actual circuit is designed to operate at about 10% of the oscillation frequency of the ring oscillator. Where this fact is taken into account, it can be said that a circuit operating at frequencies of about 40 MHz can be fabricated from the above-described TFTs.

In this way, thin-film transistors (TFTs) capable of forming a circuit which is required to operate at high speeds (generally, tens of megahertz or above) can be obtained by exploiting the invention disclosed herein.

Accordingly, for example, without operating the peripheral driver circuit of an active matrix liquid crystal display by a multiplexing scheme, the peripheral driver circuit can be integrated with the active matrix circuit on the same substrate.

With respect to S values, characteristics comparable to those of MOS transistors fabricated, using a single-crystal silicon wafer of less than 100 mV/dec, can be obtained.

A circuit which is required to exhibit various high-speed operations can be fabricated as an integrated circuit from TFTs on the same substrate by utilizing the invention disclosed herein. Furthermore, a method of fabricating this circuit is provided.

We claim:

1. An electroluminescence device comprising:
    a substrate having an insulating surface;
    a plurality of thin film transistors over the substrate, each thin film transistor having an active layer formed by patterning a semiconductor film over the substrate and at least a thermal oxide film on a surface of the active layer;
    a leveled insulating film provided over the thin film transistors; and
    a pixel electrode provided over the leveled insulating film, the pixel electrode electrically connected to the thin film transistors, respectively,
    wherein the active layer contains halogen,
    wherein the semiconductor film comprises a plurality of radial crystal grains of silicon through the whole area of the semiconductor film,
    wherein crystal growth directions in the active layers differ from one of the plurality of thin film transistors to another, respectively, and wherein each of the plurality of thin film transistors has an S-value of 100 mV/dec or less.

2. A device according to claim 1, wherein said semiconductor film comprises silicon.

3. A device according to claim 1, wherein the semiconductor film has a thickness of 100 to 700 Å.

4. A device according to claim 1, wherein the substrate is selected from the group consisting of a glass substrate, a quartz substrate, and a semiconductor substrate.

5. A device according to claim 1, further comprising auxiliary capacitors using the pixel electrodes.

6. A device according to claim 1, wherein the semiconductor film includes a material for promoting crystallization of silicon introduced into the whole area of the active layer and the material is selected from the group consisting of Fe, Co, Ni, Ru, Rh, Pd, Os, Ir, Pt, Cu, and Au.

7. A device according to claim 1, wherein the electroluminescence display device is an active matrix type display device.

8. A device according to claim 1, wherein the electroluminescence display device is included in an electric device selected from the group consisting of a portable intelligent terminal, a car navigational system, and a mobile telephone.

9. A device according to claim 1, wherein the electroluminescence device is included in an electric device selected from the group consisting of a head mounted display, a portable video camera and a projection display system.

10. An electroluminescence device comprising:
a substrate having an insulating surface;
a plurality of thin film transistors over the substrate, each thin film transistor having an active layer formed by patterning a semiconductor film over the substrate and at least a thermal oxide film on a surface of the active layer;
a leveled insulating film provided over the thin film transistors; and
a pixel electrode provided over the leveled insulating film, the pixel electrode electrically connected to the thin film transistors, respectively,
wherein the active layer contains halogen,
wherein the semiconductor film comprises a plurality of radial crystal grains of silicon through the whole area of the semiconductor film,
wherein directions of anisotropy of crystal structures in active layers differ from one of said plurality of thin film transistors to another, respectively, and
wherein each of the plurality of thin film transistors has an S-value of 100 mV/dec or less.

11. A device according to claim 10, wherein said semiconductor film comprises silicon.

12. A device according to claim 10, wherein the semiconductor film has a thickness of 100 to 700 Å.

13. A device according to claim 10, wherein the substrate is selected from the group consisting of a glass substrate, a quartz substrate, and a semiconductor substrate.

14. A device according to claim 10, further comprising auxiliary capacitors using the pixel electrodes.

15. A device according to claim 10, wherein the semiconductor film includes a material for promoting crystallization of silicon introduced into the whole area of the active layer and the material is selected from the group consisting of Fe, Co, Ni, Ru, Rh, Pd, Os, Ir, Pt, Cu, and Au.

16. A device according to claim 10, wherein the electroluminescence display device is an active matrix type display device.

17. A device according to claim 10, wherein the electroluminescence display device is included in an electric device selected from the group consisting of a portable intelligent terminal, a car navigational system, and a mobile telephone.

18. A device according to claim 10, wherein the electroluminescence device is included in an electric device selected from the group consisting of a head mounted display, a portable video camera and a projection display system.

19. An electroluminescence device comprising:
a substrate having an insulating surface;
a plurality of thin film transistors over the substrate, each thin film transistor having an active layer formed by patterning a semiconductor film over the substrate and at least a thermal oxide film on a surface of the active layer;
a leveled insulating film provided over the thin film transistors; and
a pixel electrode provided over the leveled insulating film, the pixel electrode electrically connected to the thin film transistors, respectively,
wherein the active layer contains halogen,
wherein said semiconductor film comprises a plurality of crystal grains of silicon through the whole area of the semiconductor film, each of said crystal grains grows radially from each of a plurality of points distributed through the whole surface of said semiconductor film,
wherein crystal growth directions in said active layers differ from one of said plurality of thin film transistors to another, respectively, and
wherein each of the plurality of thin film transistors has an S-value of 100 mV/dec or less.

20. A device according to claim 19, wherein said semiconductor film comprises silicon.

21. A device according to claim 19, wherein the semiconductor film has a thickness of 100 to 700 Å.

22. A device according to claim 19, wherein the substrate is selected from the group consisting of a glass substrate, a quartz substrate, and a semiconductor substrate.

23. A device according to claim 19, further comprising auxiliary capacitors using the pixel electrodes.

24. A device according to claim 19, wherein the semiconductor film includes a material for promoting crystallization of silicon introduced into the whole area of the active layer and the material is selected from the group consisting of Fe, Co, Ni, Ru, Rh, Pd, Os, Ir, Pt, Cu, and Au.

25. A device according to claim 19, wherein the electroluminescence display device is an active matrix type display device.

26. A device according to claim 19, wherein the electroluminescence display device is included in an electric device selected from the group consisting of a portable intelligent terminal, a car navigational system, and a mobile telephone.

27. A device according to claim 19, wherein the electroluminescence device is included in an electric device selected from the group consisting of a head mounted display, a portable video camera and a projection display system.

28. An electroluminescence device comprising:
a substrate having an insulating surface;
a plurality of thin film transistors over the substrate, each thin film transistor having an active layer formed by patterning a semiconductor film over the substrate and at least a thermal oxide film on a surface of the active layer;
a leveled insulating film provided over the thin film transistors; and
a pixel electrode provided over the leveled insulating film, the pixel electrode electrically connected to the thin film transistors, respectively,
wherein the active layer contains halogen,
wherein said semiconductor film comprises a plurality of crystal grains of silicon through the whole area of the semiconductor film, each of said crystal grains grows radially from each of a plurality of points distributed through the whole surface of said semiconductor film, wherein directions of anisotropy of crystal structures in active layers differ from one of said plurality of thin film transistors to another, respectively, and wherein each of the plurality of thin film transistors has an S-value of 100 mV/dec or less.

29. A device according to claim 28, wherein said semiconductor film comprises silicon.

30. A device according to claim 28, wherein the semiconductor film has a thickness of 100 to 700 Å.

31. A device according to claim 28, wherein the substrate is selected from the group consisting of a glass substrate, a quartz substrate, and a semiconductor substrate.

32. A device according to claim 28, further comprising auxiliary capacitors using the pixel electrodes.

33. A device according to claim 28, wherein the semiconductor film includes a material for promoting crystallization of silicon introduced into the whole area of the active layer and the material is selected from the group consisting of Fe, Co, Ni, Ru, Rh, Pd, Os, Ir, Pt, Cu, and Au.

34. A device according to claim 28, wherein the electroluminescence display device is an active matrix type display device.

35. A device according to claim 28, wherein the electroluminescence display device is included in an electric device selected from the group consisting of a portable intelligent terminal, a car navigational system, and a mobile telephone.

36. A device according to claim 28, wherein the electroluminescence device is included in an electric device selected from the group consisting of a head mounted display, a portable video camera and a projection display system.

* * * * *